US012243922B2

(12) United States Patent
Enea

(10) Patent No.: US 12,243,922 B2
(45) Date of Patent: Mar. 4, 2025

(54) METHOD FOR AUTO-ALIGNED MANUFACTURING OF A VDMOS TRANSISTOR, AND AUTO-ALIGNED VDMOS TRANSISTOR

(71) Applicant: STMICROELECTRONICS S.r.l., Agrate Brianza (IT)

(72) Inventor: Vincenzo Enea, Syracuse (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 105 days.

(21) Appl. No.: 18/323,317

(22) Filed: May 24, 2023

(65) Prior Publication Data
US 2024/0030300 A1     Jan. 25, 2024

Related U.S. Application Data

(60) Continuation of application No. 17/322,514, filed on May 17, 2021, now Pat. No. 11,705,493, which is a
(Continued)

(30) Foreign Application Priority Data

May 25, 2017   (IT) ..................... 102017000057056

(51) Int. Cl.
*H01L 29/417*    (2006.01)
*H01L 21/3065*   (2006.01)
(Continued)

(52) U.S. Cl.
CPC .... *H01L 29/41775* (2013.01); *H01L 21/3065* (2013.01); *H01L 21/3086* (2013.01);
(Continued)

(58) Field of Classification Search
None
See application file for complete search history.

(56) References Cited

U.S. PATENT DOCUMENTS 8,753,935 B1   6/2014   Bobde et al.
10,510,849 B2  12/2019  Enea
(Continued)

FOREIGN PATENT DOCUMENTS

CN           106129114 A      11/2016
DE      11 2005 001 434 T5     5/2007
EP            1978562 A2      10/2008

OTHER PUBLICATIONS

U.S. Appl. No. 18/168,509, filed Feb. 13, 2023.

*Primary Examiner* — Anthony Ho
(74) *Attorney, Agent, or Firm* — Seed IP Law Group LLP

(57) ABSTRACT

A MOS transistor, in particular a vertical channel transistor, includes a semiconductor body housing a body region, a source region, a drain electrode and gate electrodes. The gate electrodes extend in corresponding recesses which are symmetrical with respect to an axis of symmetry of the semiconductor body. The transistor also has spacers which are also symmetrical with respect to the axis of symmetry. A source electrode extends in electrical contact with the source region at a surface portion of the semiconductor body surrounded by the spacers and is in particular adjacent to the
(Continued)

spacers. During manufacture the spacers are used to form in an auto-aligning way the source electrode which is symmetrical with respect to the axis of symmetry and equidistant from the gate electrodes.

22 Claims, 21 Drawing Sheets

Related U.S. Application Data continuation of application No. 16/990,606, filed on Aug. 11, 2020, now Pat. No. 11,038,032, which is a continuation of application No. 16/684,066, filed on Nov. 14, 2019, now Pat. No. 10,770,558, which is a division of application No. 15/986,181, filed on May 22, 2018, now Pat. No. 10,510,849.

(51) Int. Cl.
*H01L 21/308* (2006.01)
*H01L 29/10* (2006.01)
*H01L 29/40* (2006.01)
*H01L 29/66* (2006.01)
*H01L 29/78* (2006.01)
*H01L 21/265* (2006.01)
*H01L 21/266* (2006.01)

(52) U.S. Cl.
CPC ........ *H01L 29/1095* (2013.01); *H01L 29/407* (2013.01); *H01L 29/41741* (2013.01); *H01L 29/41766* (2013.01); *H01L 29/6656* (2013.01); *H01L 29/66719* (2013.01); *H01L 29/66727* (2013.01); *H01L 29/66734* (2013.01); *H01L 29/7813* (2013.01); *H01L 21/26513* (2013.01); *H01L 21/266* (2013.01)

(56) References Cited

U.S. PATENT DOCUMENTS

| | | |
|---|---|---|
| 10,770,558 B2 | 9/2020 | Enea |
| 2006/0060916 A1 | 3/2006 | Girdhar et al. |
| 2008/0035993 A1 | 2/2008 | Cao et al. |
| 2009/0273024 A1 | 11/2009 | Hiller et al. |
| 2011/0177663 A1 | 7/2011 | Kachi |
| 2013/0049104 A1 | 2/2013 | Tai et al. |
| 2014/0284708 A1 | 9/2014 | Nishiwaki et al. |
| 2015/0008513 A1 | 1/2015 | Lin et al. |
| 2016/0218008 A1 | 7/2016 | Li et al. |
| 2023/0268421 A1 | 8/2023 | Enea et al. |

METHOD FOR AUTO-ALIGNED MANUFACTURING OF A VDMOS TRANSISTOR, AND AUTO-ALIGNED VDMOS TRANSISTOR

BACKGROUND

Technical Field

The present disclosure relates to a method for manufacturing a MOS transistor and the corresponding MOS transistor. In particular the present disclosure relates to a method for the auto-aligned manufacturing of electrical contacts of a vertical diffusion MOS (VDMOS) transistor.

Description of the Related Art

As is known, applications of power MOSFET devices may involve high currents to be controlled. A known fault mechanism relating to power MOSFET devices when high currents are present comprises the activation and consequent breakdown of the parasitic bipolar transistor intrinsic to the power MOSFET device. To overcome this malfunctioning condition it is known that voltage clamp circuits capable of limiting the voltage drop between the base and the emitter of the parasitic bipolar transistor can be used. However, the use of voltage clamp circuits adds circuit complications, increases the costs of applications and may sometimes be inefficient or insufficient to protect the device and/or the application (e.g., because of the response times necessary).

In the absence of voltage clamp circuits and under conditions in which the power MOSFET device is not activated (a condition known as unclamped inductive switching), the voltage drop between the base and the parasitic bipolar transistor's emitter could reach values such as to activate the parasitic bipolar transistor causing a fault in the power MOSFET device. In particular, FIG. 1 shows a power MOSFET device 1 under unclamped inductive switching conditions, in particular a double-diffused metal-oxide-semiconductor transistor having a vertical structure, of the known type and identified below as a VDMOS transistor, in lateral cross section and within a triaxial X, Y, Z reference system.

The VDMOS transistor 1 includes a substrate 2 of semiconductor material, for example silicon, having a first electrical conductivity (for example of the N type); the substrate 2 is bounded by a first side 2a and a second side 2b which are parallel to the X axis and opposite to each other along a direction parallel to the Z axis at right angles to the X axis. The first side 2a of the substrate 2 extends for a distance along the Z axis which is greater than the distance for which the second side 2b of the substrate 2 extends. In the remainder of the description first structural elements extending for distances along the Z axis which are greater than distances for which second structural elements extend will be indicated as being "above" the second structural elements; vice versa, they will be indicated as being "below" the latter.

Below the second side 2b of the substrate 2 there extends a first conducting region 4 in electrical contact with the substrate 2. In use, the first conducting region 4 forms a drain electrode of the VDMOS transistor 1.

A second conducting region 6 extends above the substrate 2 at a distance from the first side 2a of the substrate 2. A third conducting region 7, electrically coupled to the second conducting region 6, extends below the second conducting region 6 and at least partly penetrates within the substrate 2.

When viewed in lateral cross section the third conducting region 7 is bounded by a first side 7a and a second side 7b which are parallel to the X axis, and by a third side 7c and a fourth side 7d which are substantially parallel to the Y axis. The first side 7a of the third conducting region 7 is directly opposite the second conducting region 6 and extends for a distance greater than the distance for which the first side 2a of the substrate 2 extends. The second side 7b of the third conducting region 7 instead extends below the first side 2a of the substrate 2. The second conducting region 6 and the third conducting region 7 together form a source electrode of the VDMOS transistor 1.

A first dielectric layer 8 extends between the substrate 2 and the second conducting region 6, laterally to the third conducting region 7.

The substrate 2 includes a drain region 10 having the same electrical conductivity N as the substrate 2, which extends from the second side 2b of the substrate 2 without reaching the first side 2a of the substrate 2. The drain region 10 is bounded above by a first side 10a and below by a second side 10b which are parallel to the X axis and opposite each other along the Z axis. The first side 10a of the drain region 10 extends for a distance below the first side 2a of the substrate 2, while the second side 10b of the drain region 10 coincides with the second side 2b of the substrate 2.

The substrate 2 also includes a source region 12 having the first electrical conductivity (N) and a higher doping value in comparison with the doping of substrate 2, extending laterally to the third conducting region 7 below the first dielectric layer 8.

The substrate 2 also includes a body region 14 having a second electrical conductivity (P) of a type opposite to the first electrical conductivity, extending between the drain region 10 and the source region 12.

Within the body region 14 there extends an enriched body region 16 having the second electrical conductivity (P) and a higher doping value than the doping of the body region 10. The enriched body region 16 extends along the Z axis from the source region 12 and ends within the body region 10 without reaching the first side 10a of the drain region 10. The third conducting region 7 extends into the enriched body region 16.

A fourth conducting region 18 extends laterally to and at a distance from the drain region 10, the source region 12 and the body region 14, and is electrically insulated from the drain region 10, the source 12 and the body 14 by means of a recess dielectric layer 20. In addition to this the fourth conducting region 18 extends below the second conducting region 6, electrically insulated from the second conducting region 6 by means of the first dielectric layer 8. The fourth conducting region 18 forms a gate electrode of the VDMOS transistor 1.

The intrinsic parasitic bipolar transistor of the VDMOS transistor 1, the possible activation of which is the cause of malfunctions or breakdowns of the VDMOS transistor 1, is formed of a first P-N junction between the source region 12 and the body region 14 and by a second P-N junction between the body region 14 and the drain region 10. Thus the emitter, the base and the collector of the parasitic bipolar transistor are respectively the source region 12, the body region 14 and the drain region 10.

When in use, and under unclamped inductive switching conditions, a turn-off current $I_{OFF}$ passing through the body region 14, below the source region 12, may give rise to a voltage drop between the base and the emitter of the parasitic bipolar transistor that is sufficient to activate the latter.

The voltage drop between the base and the emitter of the parasitic bipolar transistor is given by the product of the turn-off current $I_{OFF}$ and the electrical resistance of the portion of the body region 14 which the turn-off current $I_{OFF}$ passes through. The enriched body region 16 has the function of reducing the resistance of the portion of the body region 14 through which the turn-off current $I_{OFF}$ passes.

Another way of reducing the resistance of the portion of the body region 14 through which the turn-off current $I_{OFF}$ passes comprises increasing the length of the third conducting region 7 along the direction of the X axis. However, it is not possible to increase the length of the third conducting region 7 indefinitely because of the need firstly to maintain electrical insulation between the source electrode and the gate electrode, and secondly to avoid that the doping of the enriched body region 16 influences the channel of the VDMOS transistor 1 located in the portion of the body region 14 adjacent to the fourth conducting region 18.

In addition to the abovementioned structural limitations there is a need to consider margins due to the uncertainty in the position of the third conducting region 7 caused by the technological limits of alignment. In fact, technological limits of alignment may be the cause of asymmetry in the structure of the VDMOS transistor 1. With reference to FIG. 1, it is known that the source electrode formed by the second conducting region 6 and the third conducting region 7 is not aligned with respect to the axis of symmetry G of the fourth conducting region 18 (gate electrode). Said asymmetry causes the portion of the body region 14 through which the turn-off current $I_{OFF}$ passes to be of a different length along the direction of the X axis. As a consequence the electrical resistance measured at the side 7d of the third conducting region 7 has a higher value than the electrical resistance value measured at the opposite side 7c of the third conducting region 7. In particular the electrical resistance value measured at the side 7d of the third conducting region 7 has a greater value than the value which it would have under conditions of perfect symmetry, thus increasing the probability of activating the intrinsic parasitic bipolar transistor.

BRIEF SUMMARY

In various embodiments, the present disclosure provides a method for manufacturing a MOS transistor and a corresponding MOS transistor capable of overcoming the disadvantages of the known art.

In one embodiment, the present disclosure provides a method that includes: forming a body region in a semiconductor body having a first type of conductivity, the semiconductor body having opposite first and second sides and an axis of symmetry transverse to the first and second sides, the body region having a second type of conductivity at the first side; forming a source region having the first type of conductivity within the body region, the source region extending into the body region from the first side; forming a drain electrode on the second side; forming a gate electrode in the semiconductor body at the first side, the gate electrode laterally facing the source region and symmetrical with respect to the axis of symmetry; forming one or more structural regions laterally with respect to the gate electrode, the one or more structural regions being symmetrical with respect to the axis of symmetry and having a surface, the surface of the one or more structural regions being spaced farther apart from the second side of the semiconductor body than the first side of the semiconductor body is spaced apart from the second side of the semiconductor body so as to form a step between said surface of the one or more structural regions and the first side of the semiconductor body; forming a structural layer on the one or more structural regions, the step and the first side of the semiconductor body; forming at said step one or more spacers by performing an unmasked anisotropic etching of said structural layer with a main etching direction parallel to the axis of symmetry, the one or more spacers being symmetrical with respect to the axis of symmetry and surrounding an exposed portion of the first side that includes the axis of symmetry; and forming a source electrode in electrical contact with the source region at said exposed portion of the first side.

In another embodiment, the present disclosure provides a MOS transistor that includes a semiconductor body that is bounded by a first and a second side, the semiconductor body having a first type of conductivity and an axis of symmetry transverse to the first and second side. A body region having a second type of conductivity region extends into the semiconductor body from the first side. A source region having the first type of conductivity extends into the body region from the first side. A drain electrode is disposed on the second side of the semiconductor body, and a gate electrode extends into the semiconductor body from the first side. The source electrode laterally faces the source region and the body region in a symmetrical manner with respect to the axis of symmetry. One or more structural regions are disposed laterally to the gate electrode and are symmetrical with respect to the axis of symmetry, and the one or more structural regions have a surface. The surface of the one or more structural regions is spaced farther apart from the second side of the semiconductor body than the first side of the semiconductor body is spaced apart from the second side of the semiconductor body so as to define a step between the surface of the one or more structural regions and the first side of the semiconductor body. One or more spacers surround a portion of the first side of the semiconductor body, and the one or more spacers are symmetrical with respect to the axis of symmetry and adjacent to the one or more structural regions. A source electrode is in electrical contact with the source region at the portion of the first side surrounded by the one or more spacers, and the source electrode is adjacent to the one or more spacers.

In yet another embodiment, the present disclosure provides a device that includes a drain region having a first conductivity type. A drain electrode is disposed on the drain region, and a body region is disposed on the drain region opposite the drain electrode. The body region has a second conductivity type that is opposite to the first conductivity type. An enriched region extends completely through the body region, and the enriched region has a higher concentration of dopants of the second conductivity type than the body region. A source region is disposed on the body region, and a source electrode is disposed on the enriched region. The source electrode contacts side surfaces of the source region.

BRIEF DESCRIPTION OF THE SEVERAL VIEWS OF THE DRAWINGS

For a better understanding of the present disclosure, embodiments of the present disclosure will now be described, purely by way of non-limiting examples, with reference to the appended drawings, in which.

DETAILED DESCRIPTION

With reference to FIGS. 2-21, stages in the manufacture of a VDMOS transistor 21 according to one embodiment of the present disclosure are described. The VDMOS transistor 21 is represented within a triaxial reference system having X, Y and Z axes at right angles to each other. FIGS. 2-20 illustrate a single cell 100 of the VDMOS transistor 21; in general the VDMOS transistor 21 may comprise a plurality of cells 100 according to FIGS. 2-20, located one alongside the other.

Figure 1:
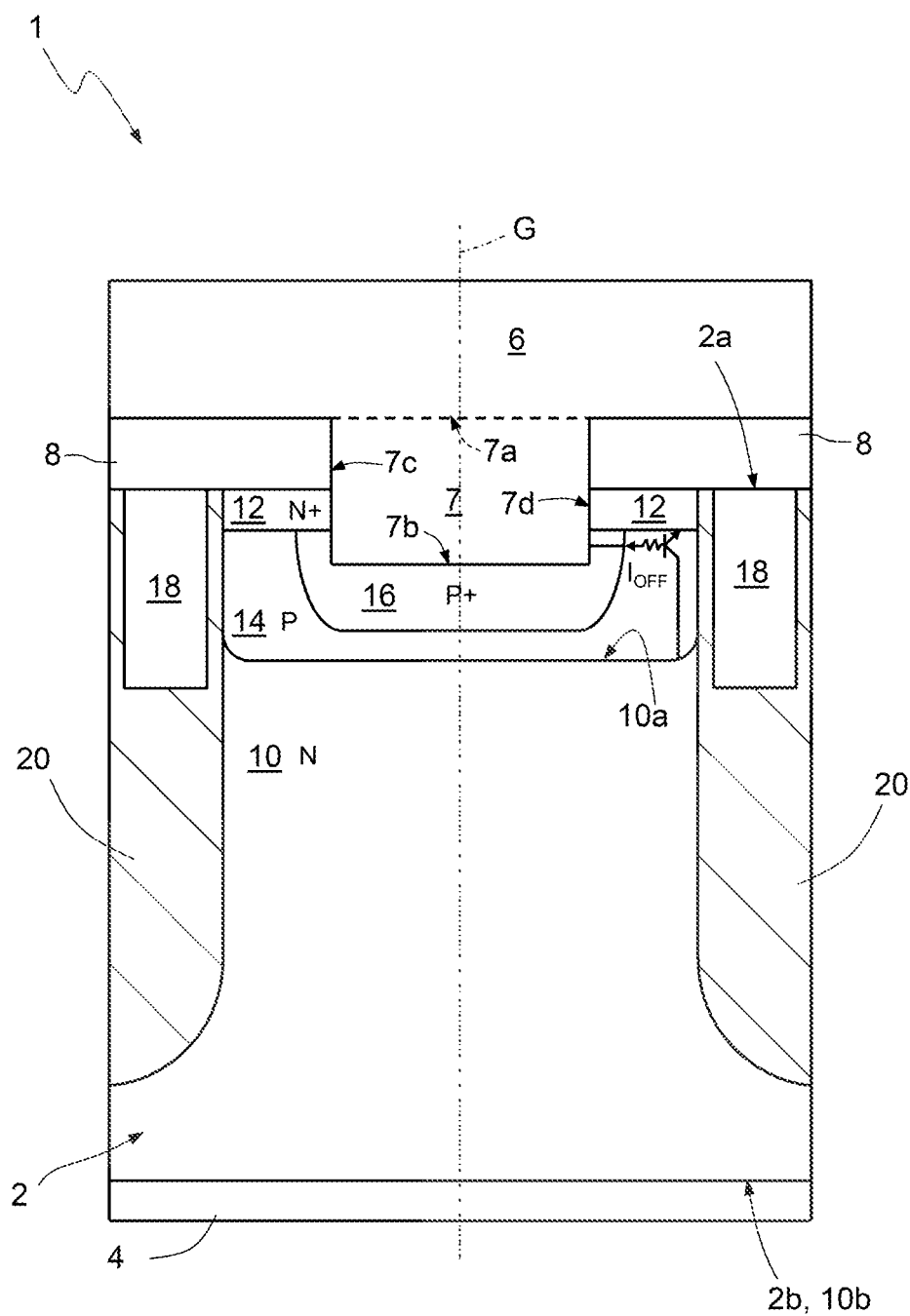
FIG. 1 shows in a lateral cross-sectional view a VDMOS transistor according to a known type.
Figure 2:
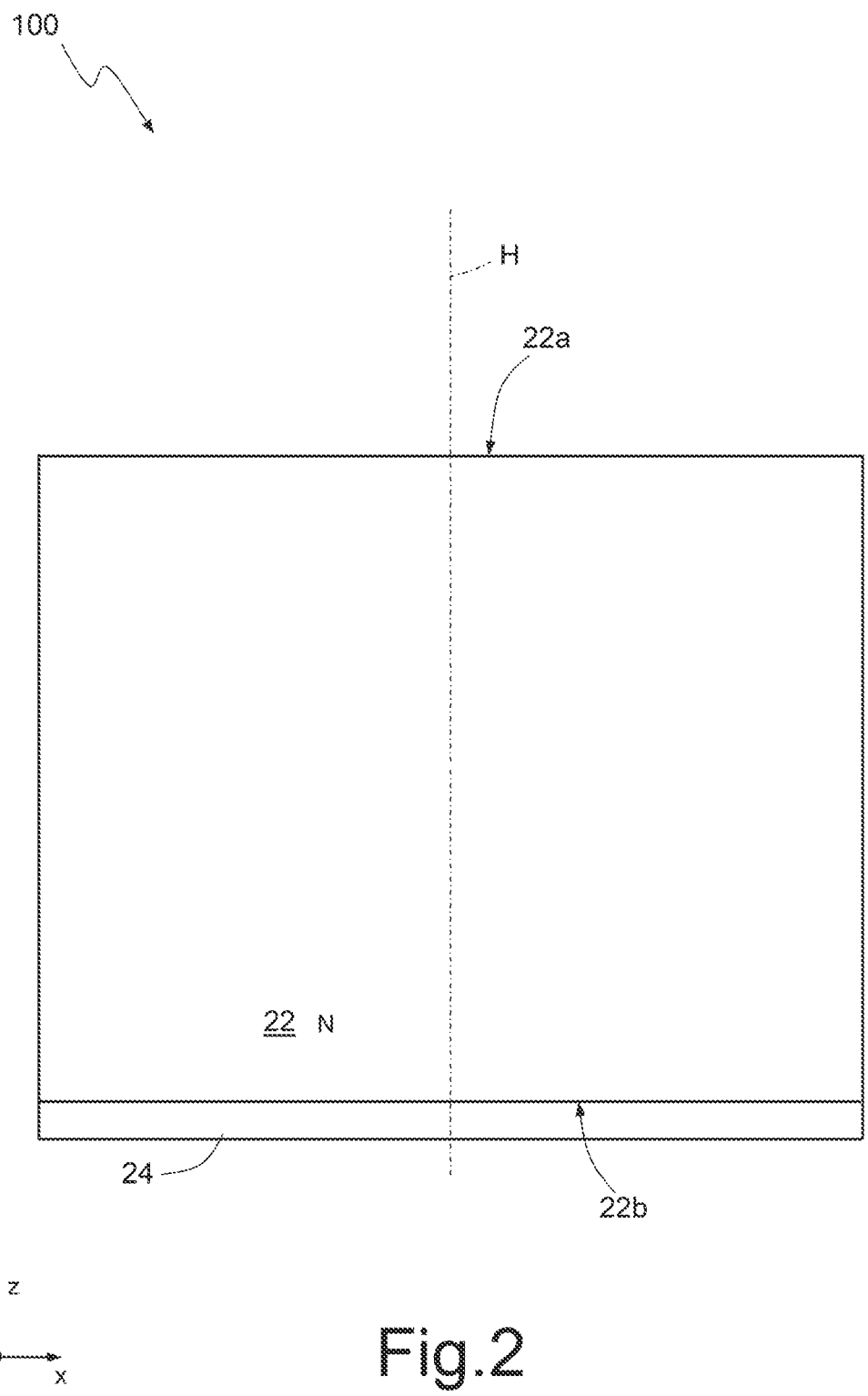
FIGS. 2-21 are lateral cross-sectional views showing various stages in the manufacture of a VDMOS transistor according to embodiments of the present disclosure.

With reference to FIG. 2, there is provided a wafer including a substrate 22 of semiconductor material, for example silicon, having a first conductivity, in this case of the N type, and doped for example with $2 \cdot 10^{16}$ atoms/cm$^3$; the substrate 22 is bounded by a first side 22a and a second side 22b parallel to the X axis and opposite each other in a direction parallel to the Z axis.

A first conducting region 24, for example of a metal material such as aluminum, which is electrically coupled to the substrate 22 and extends below the second side 22b of the substrate 22 is formed at the second side 22b of the substrate 22. The first conducting region 24 forms a drain electrode of the VDMOS transistor 21.

Figure 3:
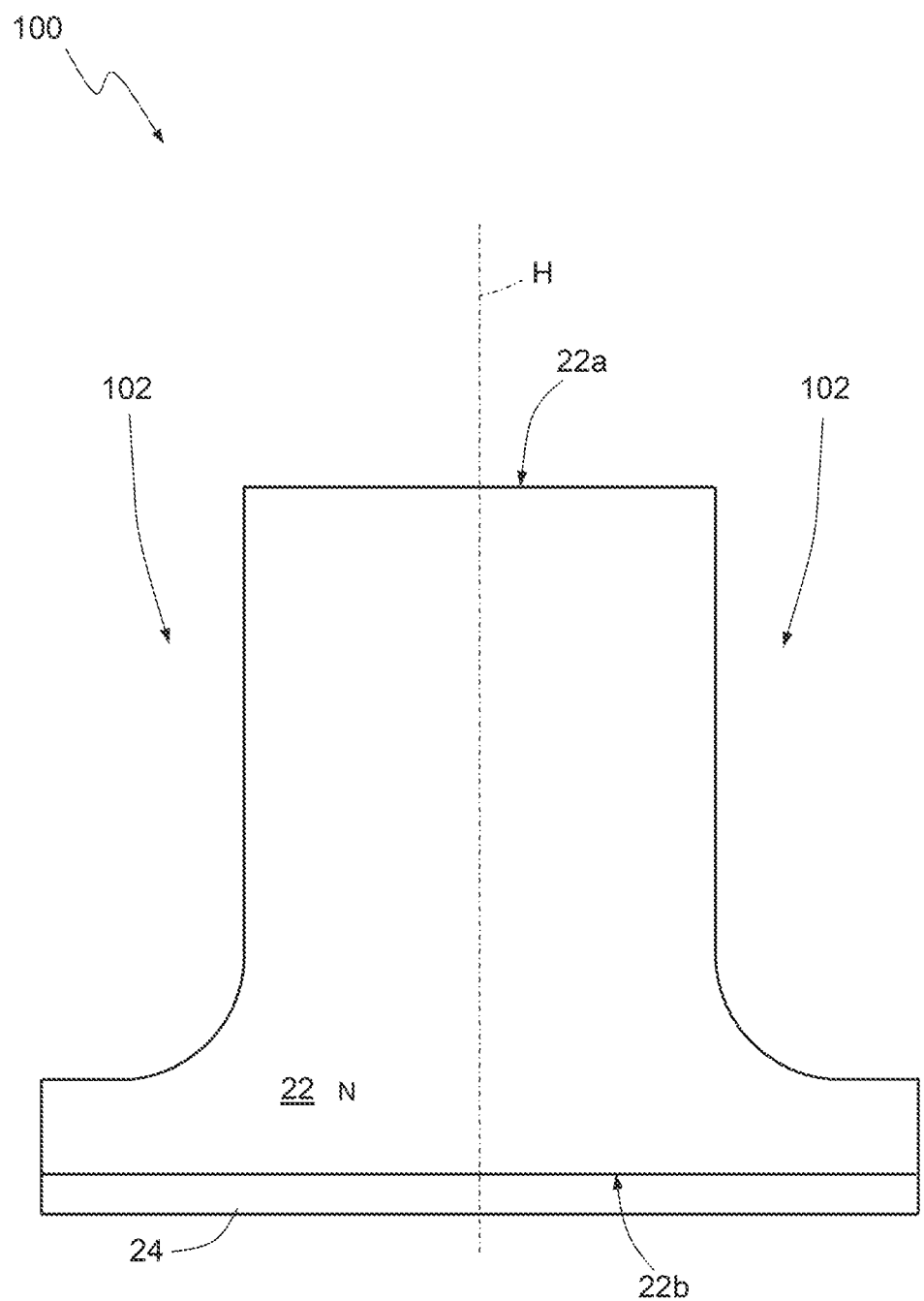

Then, FIG. 3, recesses 102 extending across part of the substrate 22 from the first side 22a and having a principal length along the Z axis of approximately 6 µm are formed. The recesses 102 extend symmetrically with respect to an axis of symmetry H of the cell 100, parallel to the Z axis. According to one embodiment the recesses 102 are formed by means of stages of photolithography and etching of the substrate 22 which are in themselves known. In particular anisotropic etching, for example of the DRIE or RIE type, is used.

Figure 4:
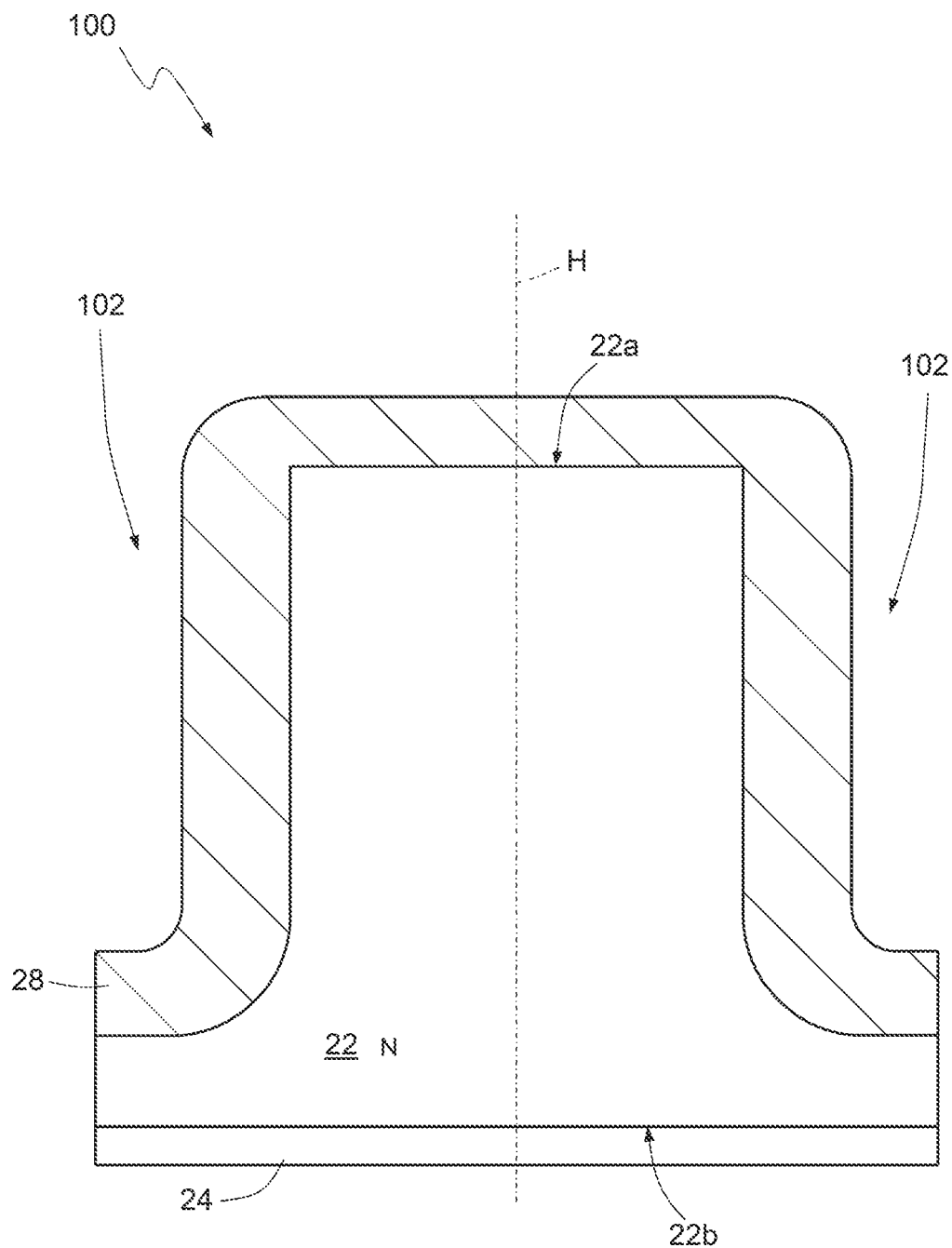

Then, FIG. 4, there follows the stage of forming a field plate oxide layer 28 approximately 0.6 µm thick above the first side 22a of the substrate 22 and within the recesses 102. The field plate oxide layer 28 is of a thickness such as to only partly fill the recesses 102 (in other words the thickness of the field plate oxide layer 28 along the X axis is less than half of the width of each recess 102, again along the X axis). The field plate oxide layer 28 is for example formed through a stage of depositing silicon dioxide and/or thermal growth of silicon dioxide.

Figure 5:
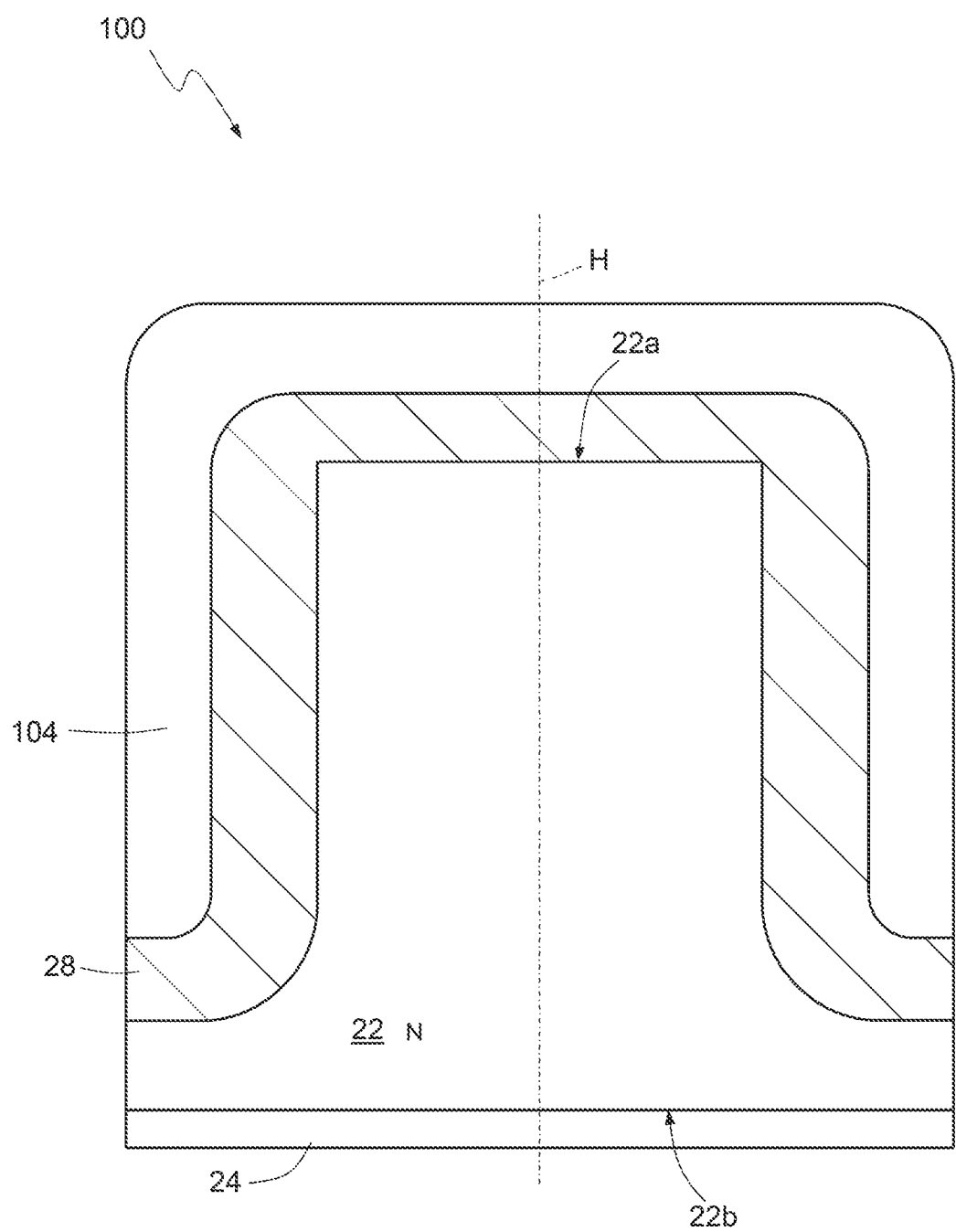

Then, FIG. 5, a first polysilicon layer 104 having a thickness of approximately 1.5 µm is formed above the field plate oxide layer 28. The first polysilicon layer 104 is of a thickness such as to completely fill the recesses 102. The first layer of polysilicon 104 is for example formed by vapor deposition.

Figure 6:
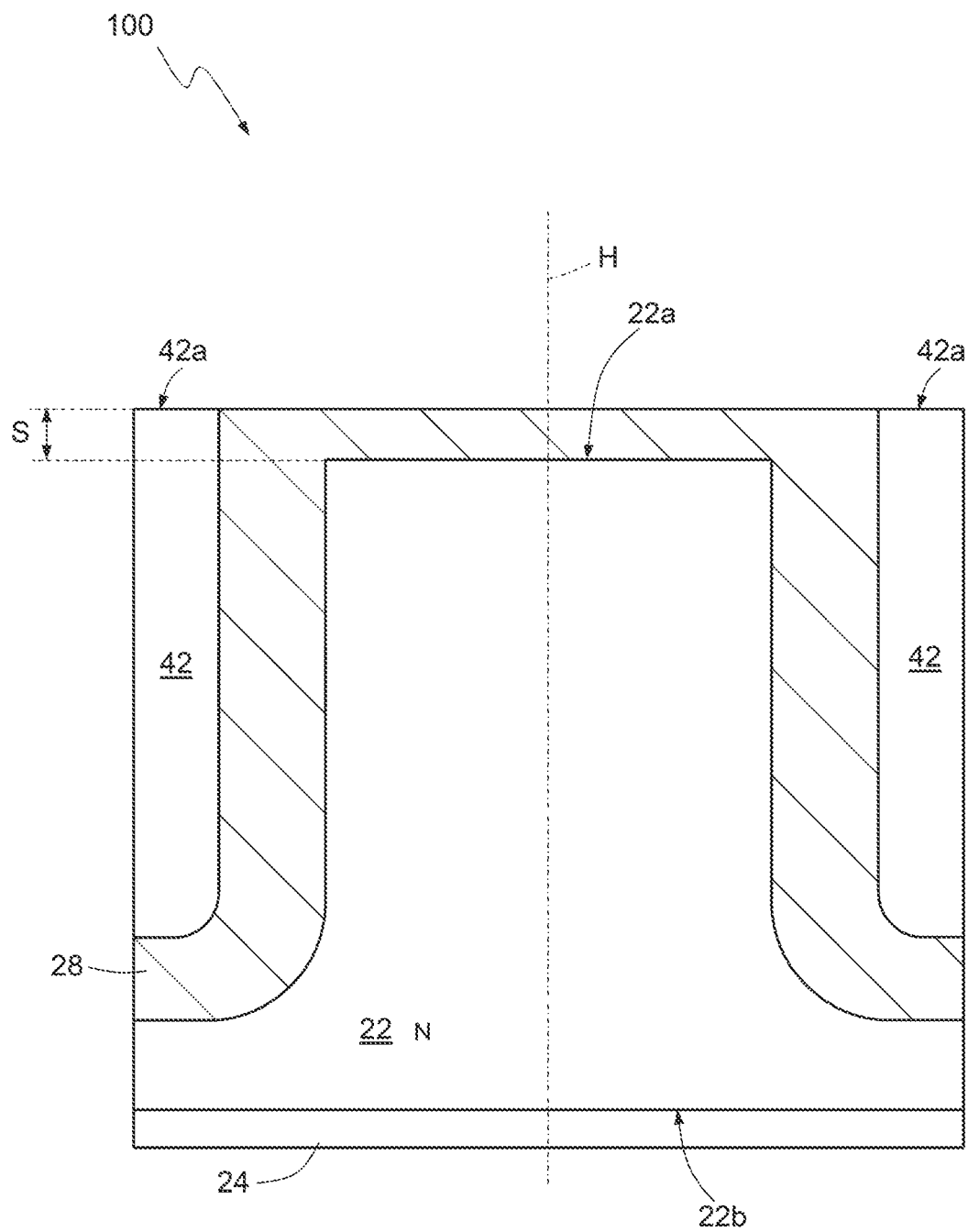

Then, FIG. 6, there follows a stage of reducing the thickness of the first layer of polysilicon 104 and the field plate oxide layer 28. This stage is for example performed by grinding, or chemical-mechanical planarization, CMP (chemical-mechanical planarization or chemical-mechanical polishing). The planarization reduces the thickness of the cell 100, and is performed for a time sufficient to expose the field plate oxide layer 28.

In this way two polysilicon regions which are electrically insulated from each other are formed within the recesses 102. In particular, these polysilicon regions together form a recess electrode 42 of the VDMOS transistor 21, which is auto-aligned with respect to the axis of symmetry H and electrically insulated from the substrate 22 by means of corresponding field plate oxide layers 28. According to one aspect of the present disclosure the CMP operation is interrupted before it reaches the first side 22a of the substrate 22. In this way, a field plate oxide region 28 having a thickness of between 0.25 µm and 0.35 µm along the Z axis extends above the first side 22a of the substrate 22. In addition to this it is known that following the CMP operation both the polysilicon regions forming the recess electrode 42 extend along Z until they reach a length greater than the corresponding length reached by the first side 22a of the substrate 22, again along Z. In other words there is an offset or step, S, corresponding to the thickness of the portion of the field plate oxide region 28 between an upper surface 42a of the polysilicon regions of the recess electrode 42 and the first side 22a of the substrate 22 which extends from and above the first side 22a of the substrate 22.

Figure 7:
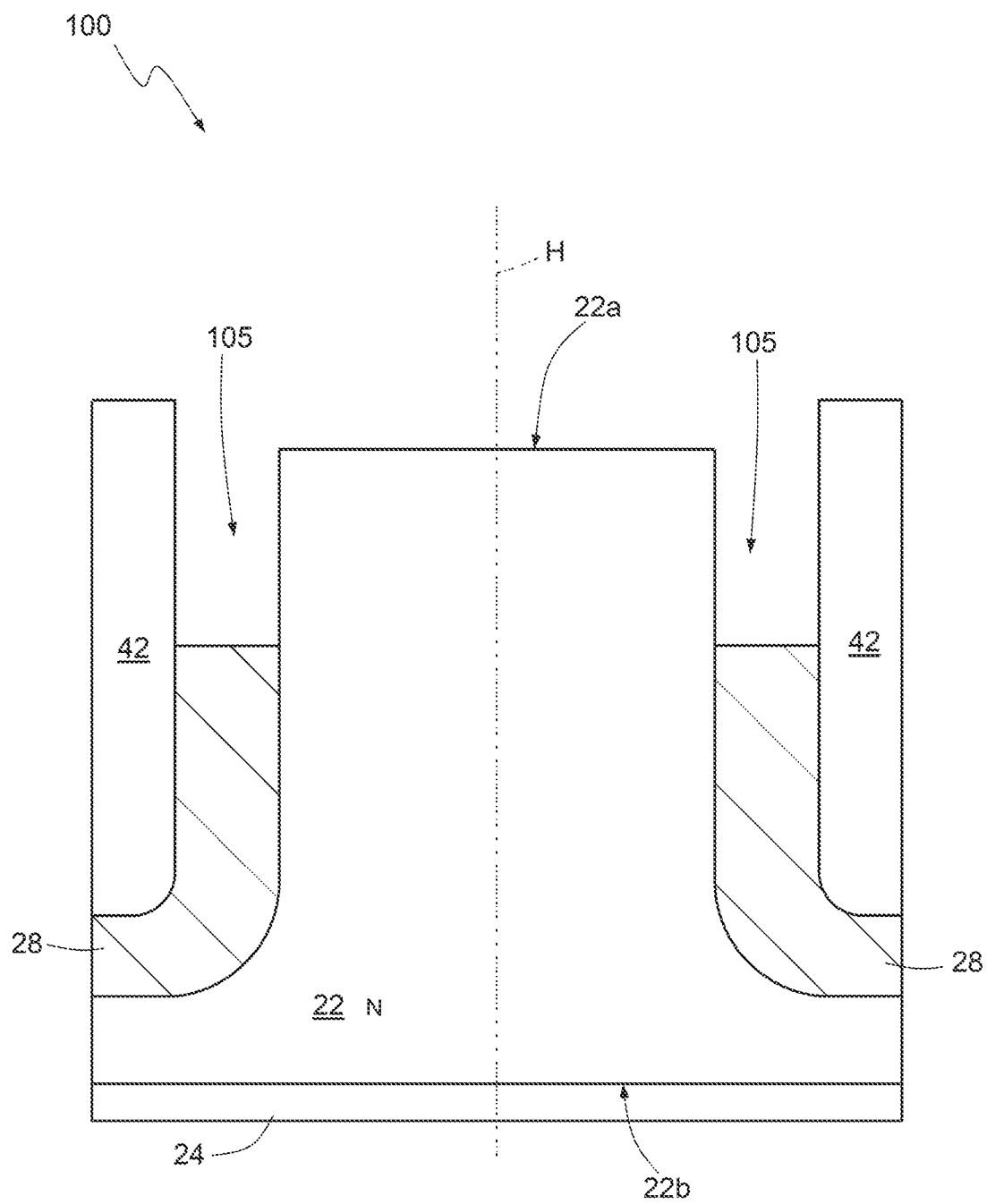

Then, FIG. 7, there follows the stage of etching the field plate oxide layer 28 selectively with respect to the substrate 22 and the recess electrode 42. For example, etching of the field plate oxide layer 28 is carried out by wet etching. The etching proceeds by reducing the thickness of the field plate oxide layer 28, wholly removing the field plate oxide layer 28 from above the substrate 22 and continuing until the upper surface of the field plate oxide layer 28 reaches a given depth, for example 1.3 µm, measured along the Z direction from the first side 22a of the substrate 22. In this way two recesses 105 at the field plate oxide layer 28 are formed between the substrate 22 and the recess electrode 42.

Figure 8:
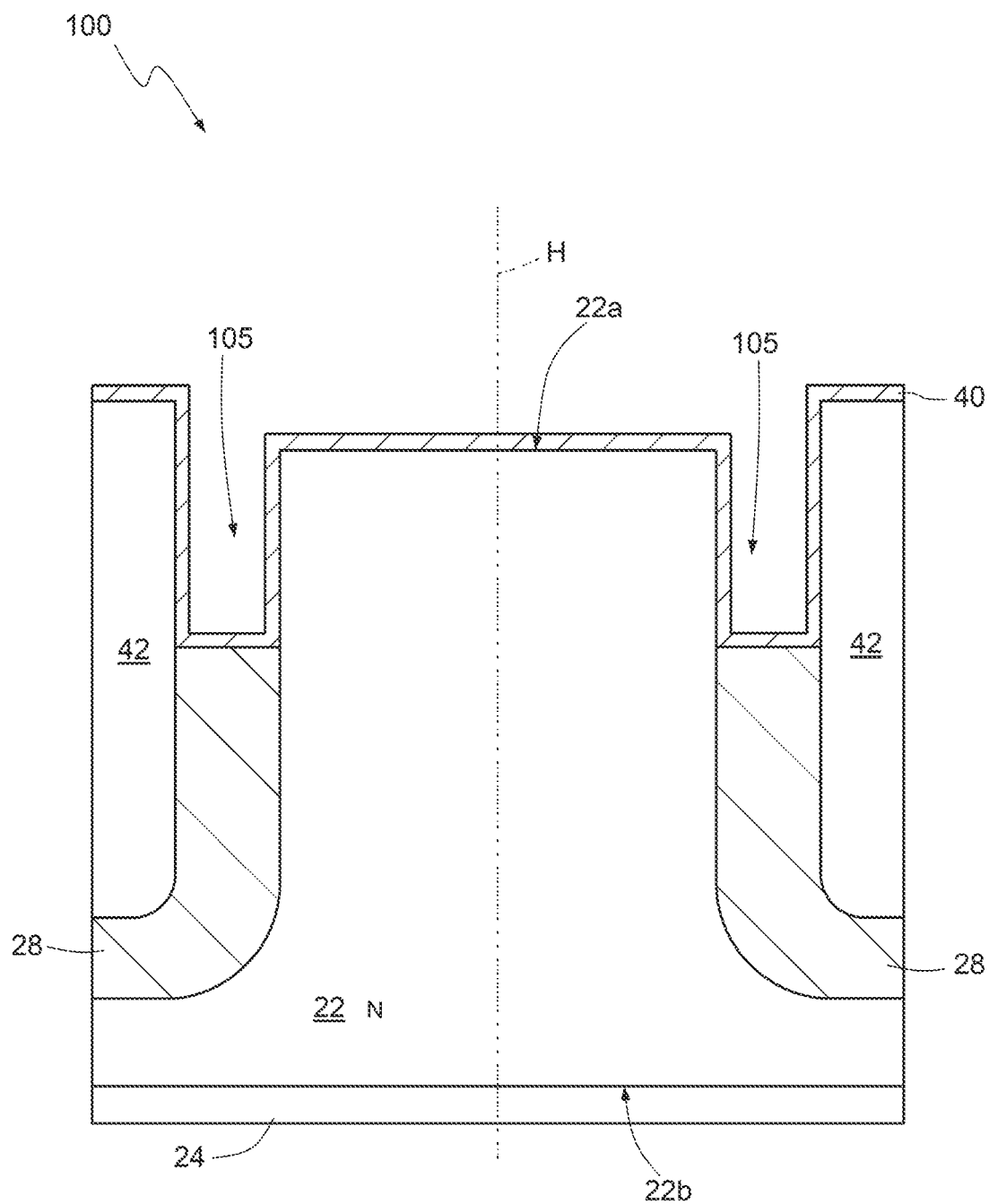

Then, FIG. 8, there follows the stage of forming a gate oxide layer 40, for example of silicon dioxide, $SiO_2$, of a thickness of for example 700 Å, above the cell 100, and in particular on the surface 22a of the substrate 22 and within the recesses 105. The gate oxide layer 40 covers the lateral walls and the bottom of the recesses 105 and is of a thickness such as to only partly fill the recesses 105. The gate oxide layer 40 is for example formed by depositing silicon dioxide. It is obvious that other dielectric materials may be used as an alternative to silicon dioxide in different embodiments.

Figure 9:
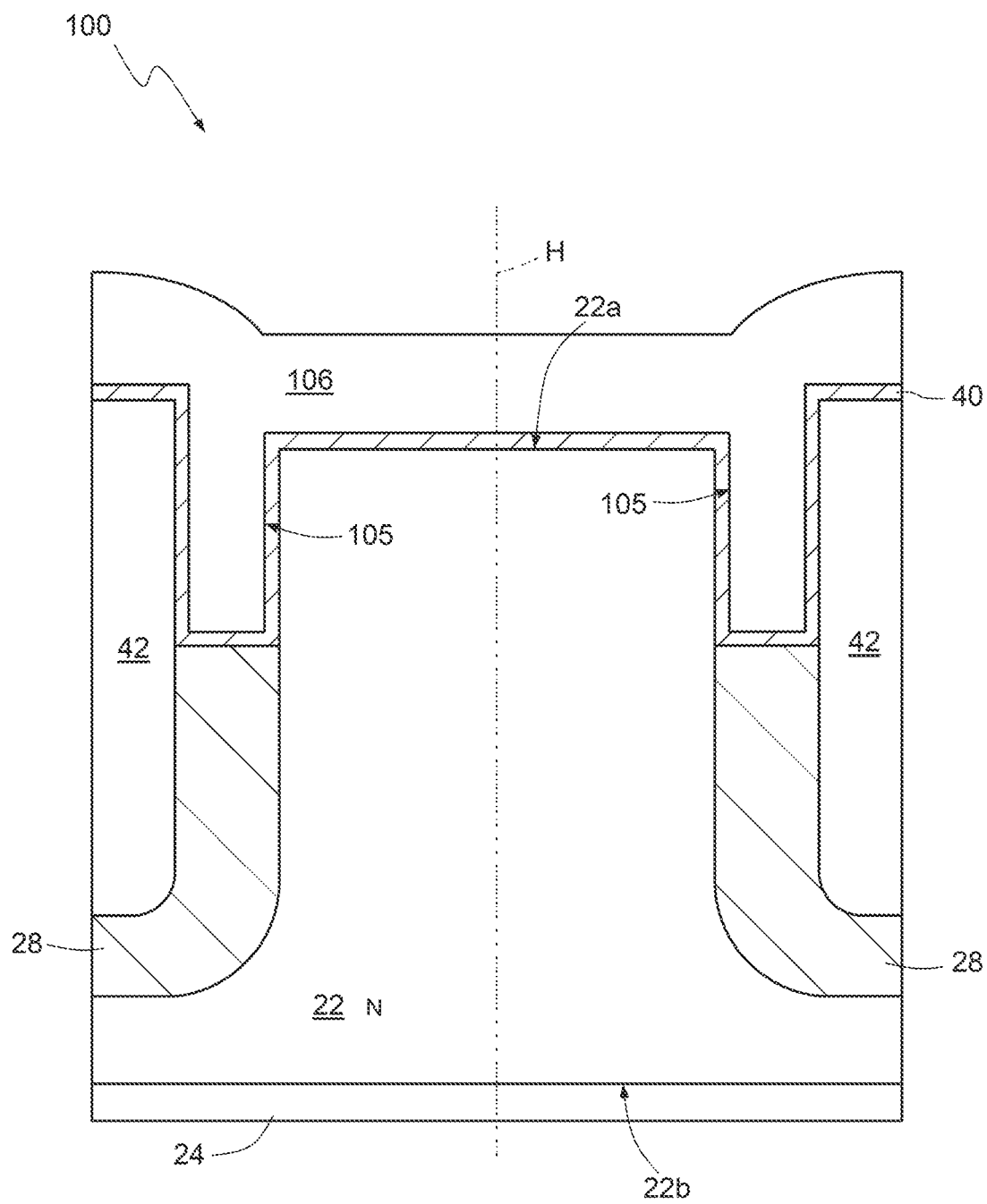

Then, FIG. 9, there follows the stage of forming a second polysilicon layer 106 of a thickness of between 1.45 µm and 1.55 µm above the gate oxide layer 40. The second polysilicon layer 106 completely fills the recesses 105. The second polysilicon layer 106 is formed for example by vapor deposition. The second polysilicon layer 106 forms a gate electrode of the VDMOS transistor 21 during subsequent stages of the manufacturing process.

Figure 10:
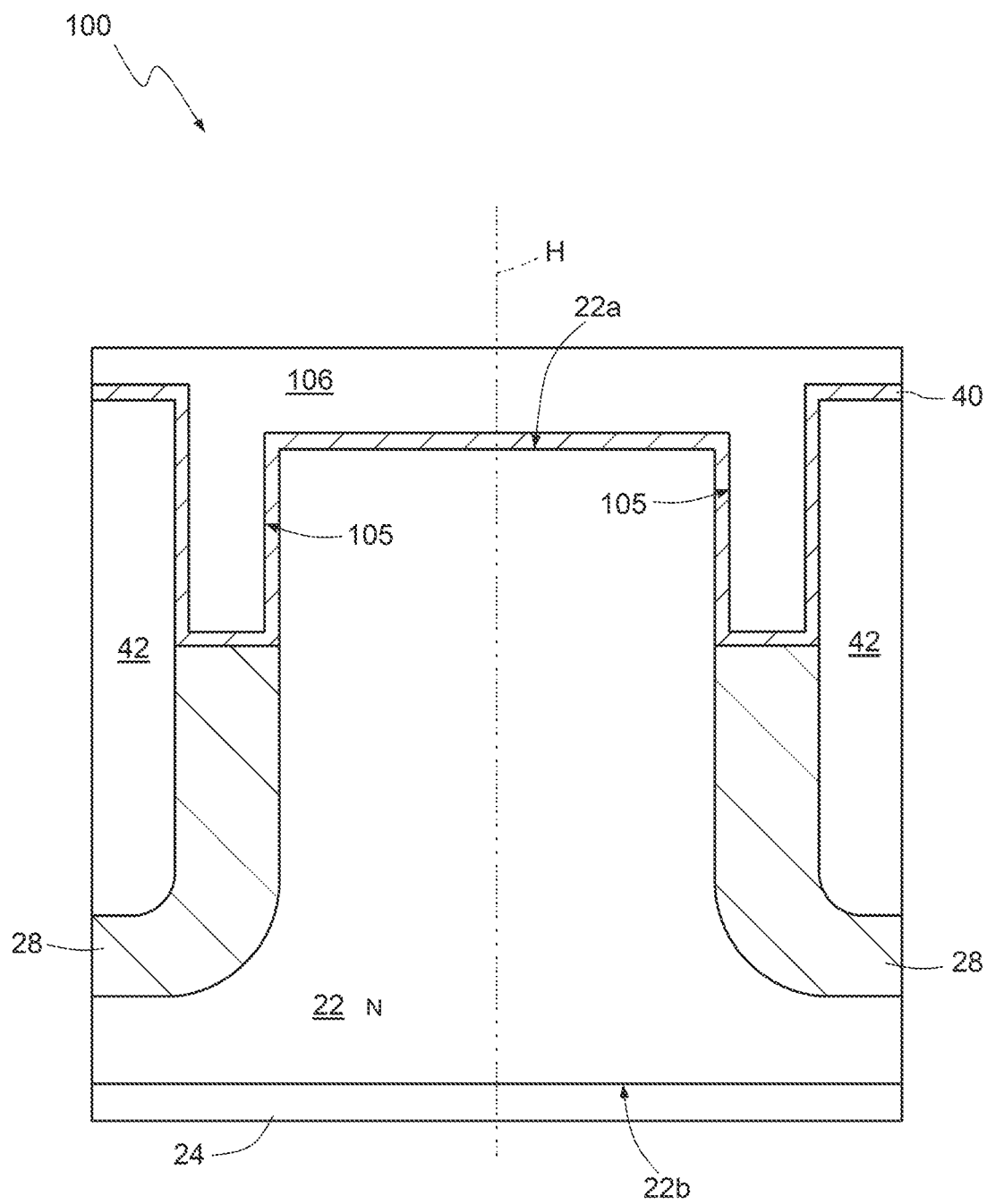

Then, FIG. 10, there follows the stage of reducing the thickness of the second polysilicon layer 106, for example by grinding or known chemical-mechanical etching techniques (chemical-mechanical planarization, CMP). The stage of reducing the thickness of the second polysilicon layer 106 continues for a time sufficient to obtain a residual thickness of between 0.45 µm and 0.55 µm of the polysilicon layer 106 above the gate oxide layer 40.

Figure 11:
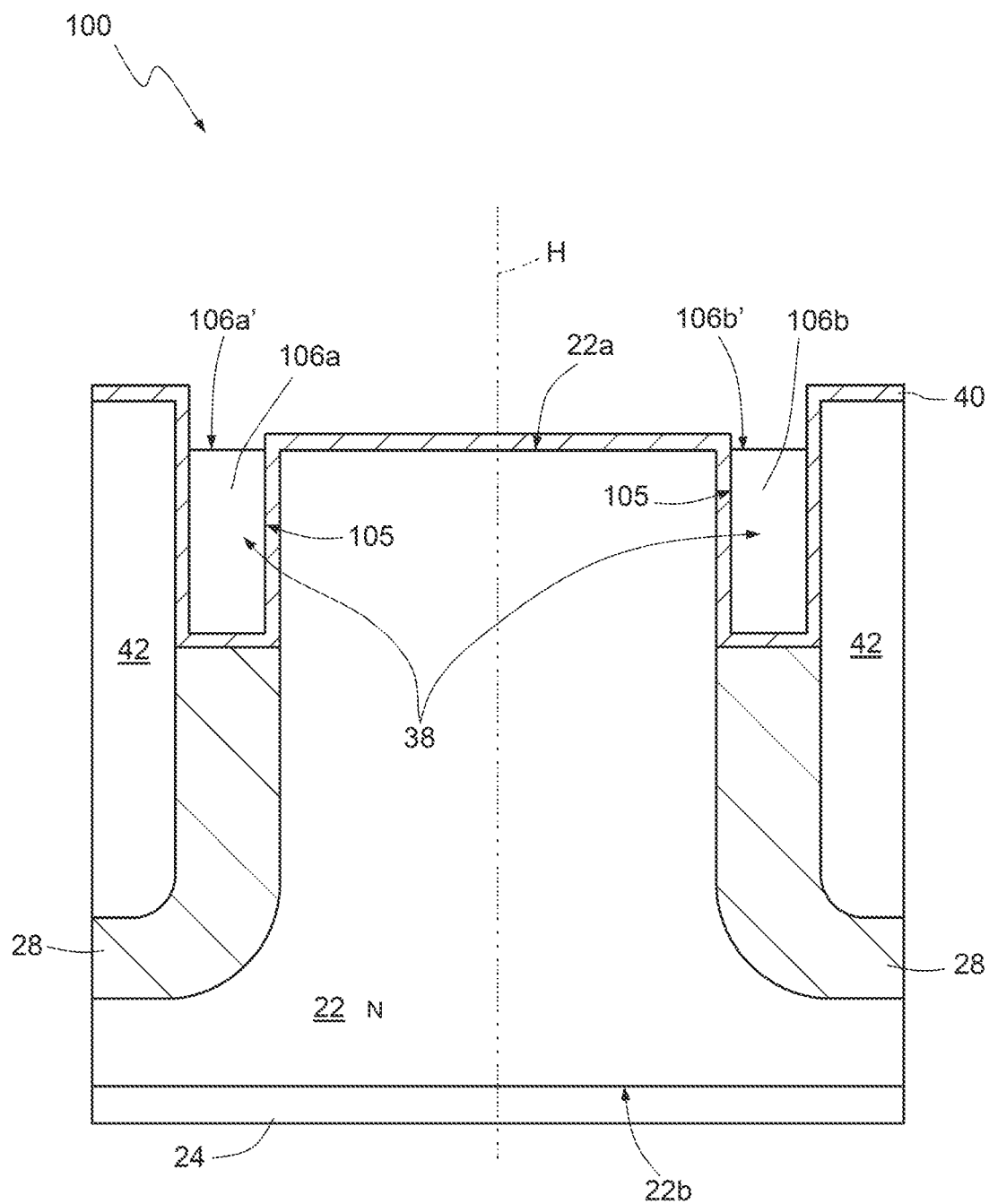

Then, FIG. 11, there follows a stage of selective etching of the second polysilicon layer 106 with respect to the gate oxide layer 40. For example, etching of the second polysilicon layer 106 is carried out by means of dry etching. The etching proceeds by reducing the thickness of the second polysilicon layer 106 until it exposes the gate oxide layer 40 above the first layer 22a of the substrate 22, forming (in lateral cross-sectional view) two polysilicon regions 106a, 106b, which are separate from each other and each extend in a corresponding recess 105. A respective upper face 106a', 106b' of the polysilicon regions 106a, 106b is substantially aligned with the first side 22a of the substrate 22; as an alternative the upper face 106a', 106b' of the polysilicon regions 106a, 106b extends for a shorter distance along Z (a few fractions of a micrometer, e.g., 0.1-0.5 µm) in comparison with the distance for which the first side 22a of the substrate 22 extends (in this way the leakage between the electrodes is reduced).

Viewed in cross section, the polysilicon regions 106a, 106b are auto-aligned with respect to the axis of symmetry H and together form the gate electrode of the VDMOS transistor 21, here indicated by the reference number 38. It is therefore obvious that the gate oxide layer 40 has the function of electrically insulating the gate electrode from the substrate 22 and the recess electrode 42.

Figure 12:
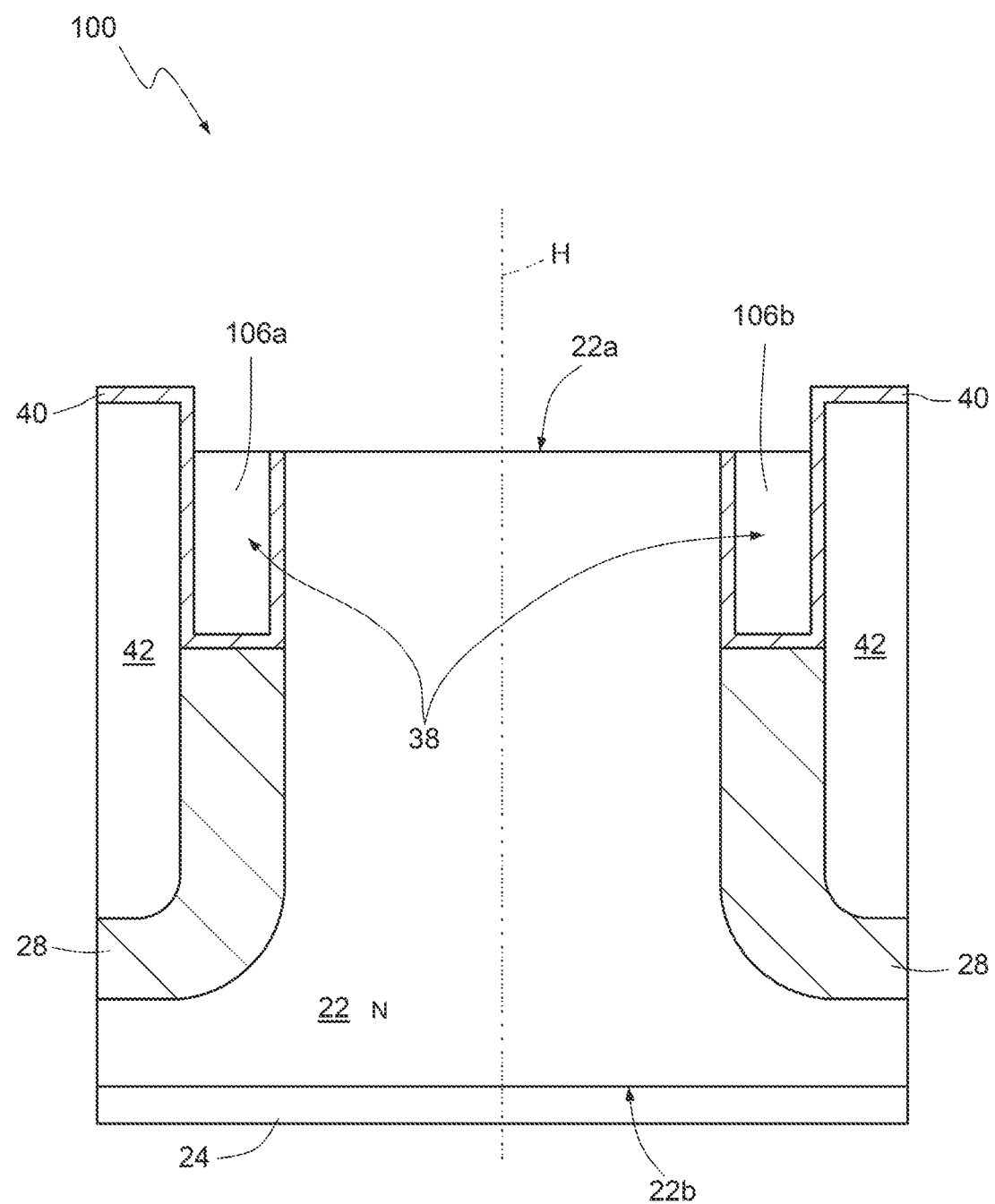

Then, FIG. 12, there follows the stage of etching the oxide region of gate 40 at the first side 22a of the substrate 22.

For example, etching of the gate oxide layer 40 is performed by wet etching for a fixed time. Etching proceeds until the gate oxide layer 40 above the first side 22a of the substrate 22 is completely removed, while ensuring a congruent residual thickness of gate oxide layer 40 above the recess electrode 42 (for example of approximately 0.10-0.15 µm). For this purpose it is known that the thickness of the oxide grown on the recess electrode 42 is approximately three times greater than the thickness of the gate oxide layer 40 grown on the polysilicon regions 106a and on the substrate 22 as a result of the greater concentration of doping agent in the recess electrode 42. In this way the unmasked time-limited etching of the gate oxide layer nevertheless ensures a residual thickness of oxide above the recess electrode 42. It is however obvious that it is possible to carry out this stage using known techniques of photolithography, using a mask protecting the oxide portions above the recess electrode 42.

Figure 13:
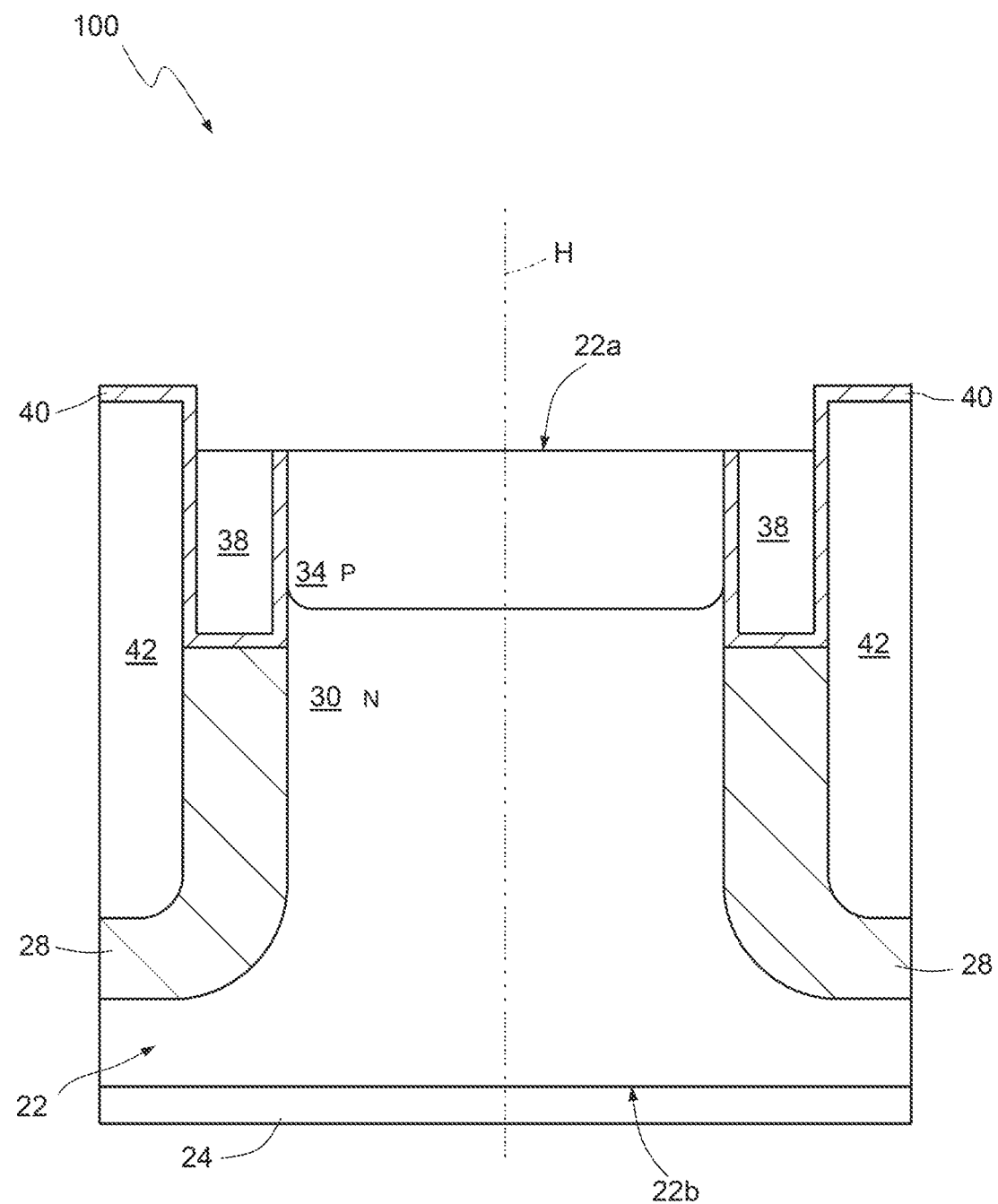

Then, FIG. 13, there follows the stage of forming a body region of the VDMOS transistor 21. This stage first of all provides for the unmasked implanting of doping species having a conductivity of the P type, for example boron, opposite to the first conductivity, of the N type, of the substrate 22. In this way an implanted region which extends along the first side 22a of the substrate 22 is formed. Implanting is for example performed using an implanting energy of 150 KeV, achieving a concentration of doping species of approximately $1 \cdot 10^{18}$ atoms/cm$^3$.

There then follows a stage of heat treatment at a temperature of approximately 1000° C. for approximately 30 minutes in order to encourage isotropic diffusion of the implanted doping species, forming the body region 34. The body region 34 extends along the Z direction to a maximum depth which is less than the maximum depth reached by the polysilicon regions 106a, 106b of the gate electrode 38. For example, the body region 34 reaches a depth of approximately 0.8 µm along Z from the first side 22a of the substrate 22. The region of the substrate 22 which is not reached by the diffusion of the doping species, and is therefore outside the body region 34, forms a drain region 30 of the substrate 22.

Figure 14:
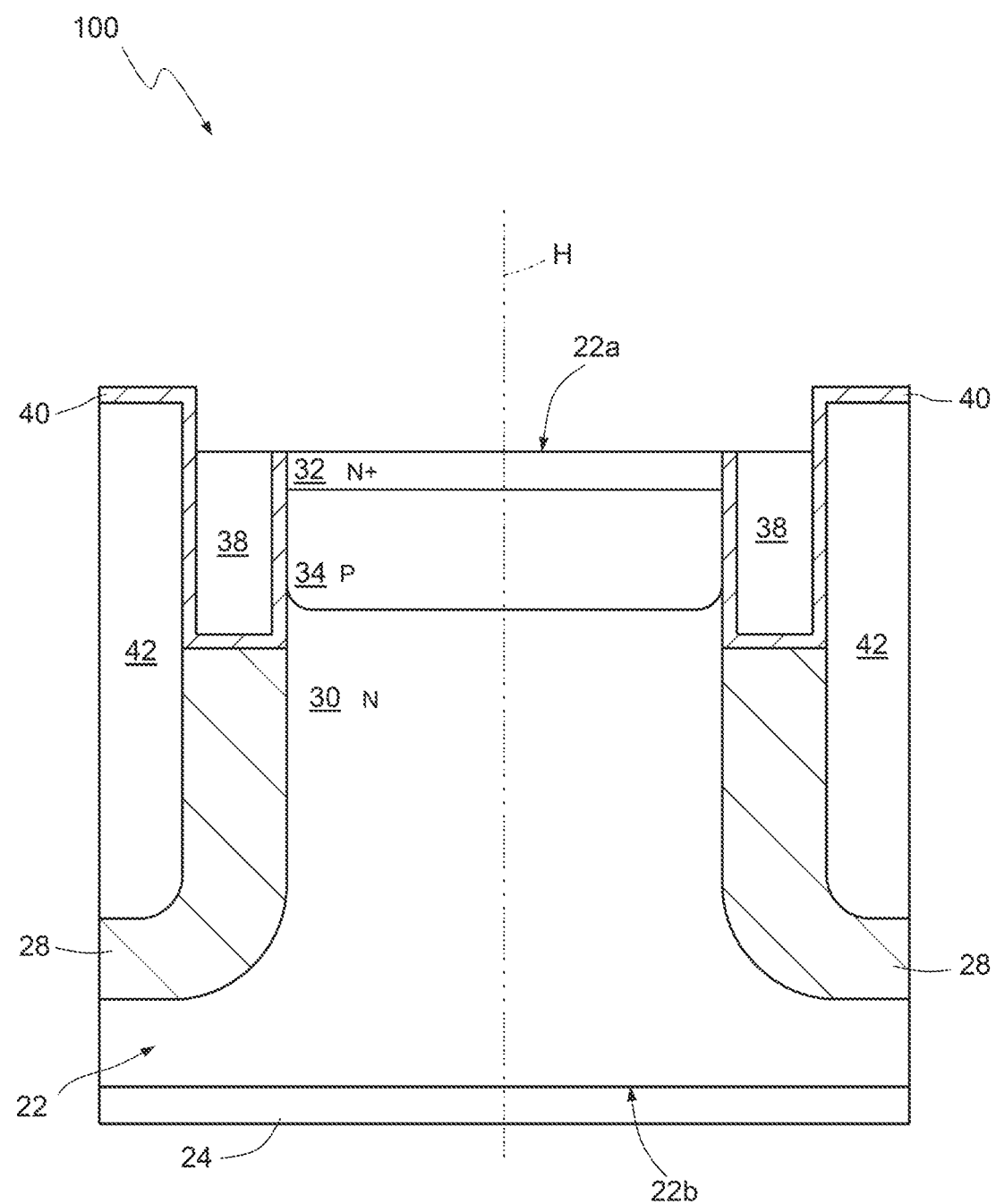

Then, FIG. 14, there follows the stage of forming a source region 32 of the VDMOS transistor 21. For this purpose doping species having the first conductivity (of the N+ type), for example arsenic, are implanted at the first side 22a of the substrate 22, within the body region 34. Implantation is carried out using an implantation energy of for example 30 KeV, achieving a concentration of doping species of the order of 1E+20.

There then follows a stage of heat treatment at a temperature of approximately 1000° C. for approximately 30 minutes to encourage isotropic diffusion of the implanted doping species, forming the source region 32. The source region 32 extends along the direction of the Z axis to a depth smaller than that of the body region 34. For example, the source region 32 reaches a depth of approximately 0.3 µm below the first side 22a of the substrate 22.

Figure 15:
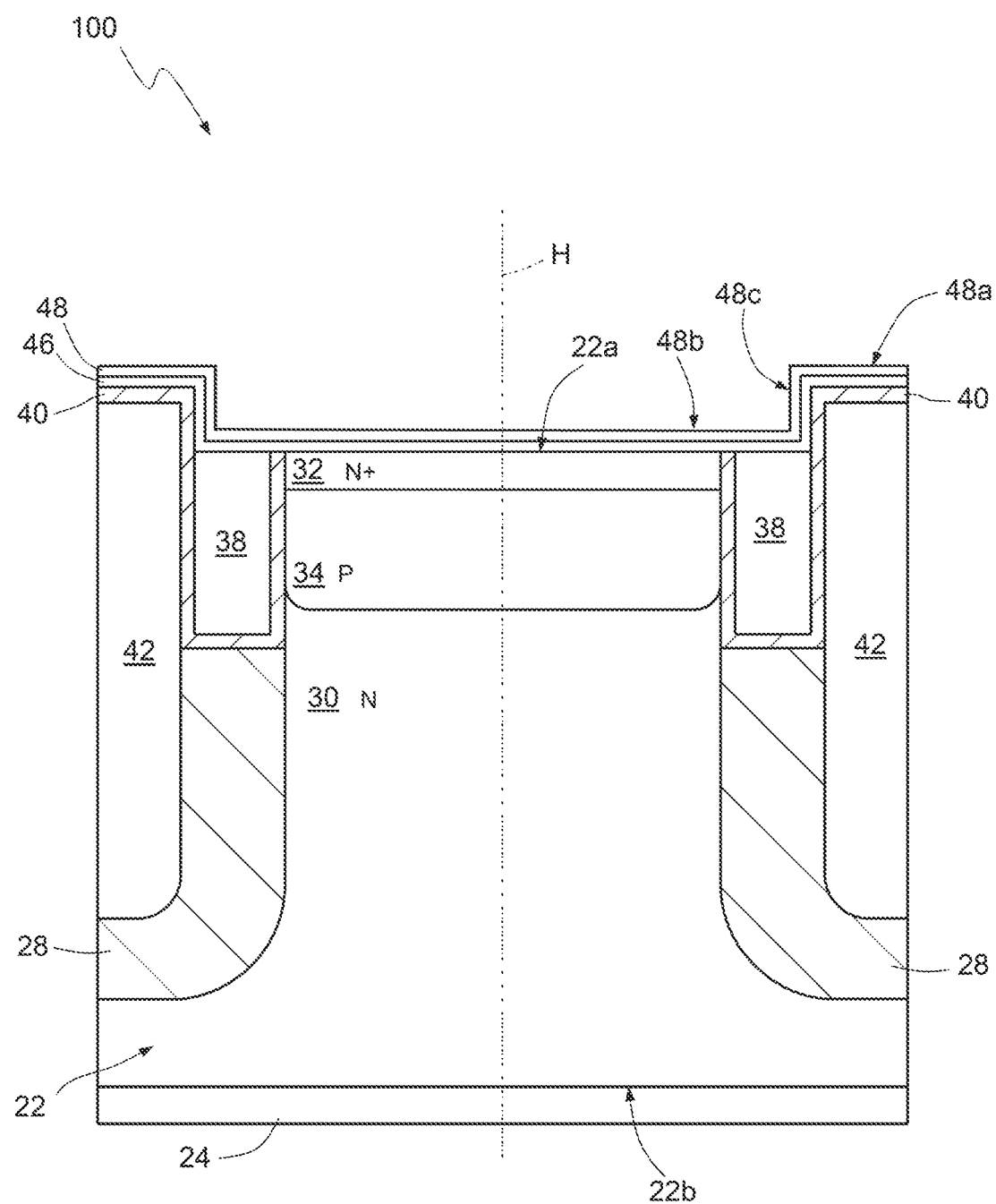

Then, FIG. 15, there follows the stage of forming a dielectric multilayer on the upper surface of the cell 100, comprising a pad oxide layer 46, for example silicon dioxide, SiO$_2$, and an etch-stop layer 48, for example of silicon nitride, Si$_3$N$_4$, above the pad oxide layer 46. The pad oxide layer 46 is formed by thermal oxidation and has a thickness of approximately 15 nm. The etch-stop layer 48 is formed for example by CVD deposition and has a thickness of approximately 30 nm. The dielectric multilayer is deposited so that it conforms to the upper surface of the cell 100. As a consequence the etch-stop layer 48 comprises a first surface portion 48a extending horizontally (that is, parallel to the X axis) above the recess electrode 42, and a second surface portion 48b extending horizontally (that is, parallel to the X axis) above the first side 22a of the substrate 22 and the gate electrode 38. The first surface portion 48a therefore extends for a distance along Z which is greater than the distance for which the second surface portion 48b extends. Vertical walls 48c (parallel to the direction of the Z axis) connect the first surface portion 48a to the second surface portion 48b. The offset between the first surface portion 48a and the second surface portion 48b along Z is substantially equal to the value of the offset S described with reference to FIG. 6.

Figure 16:
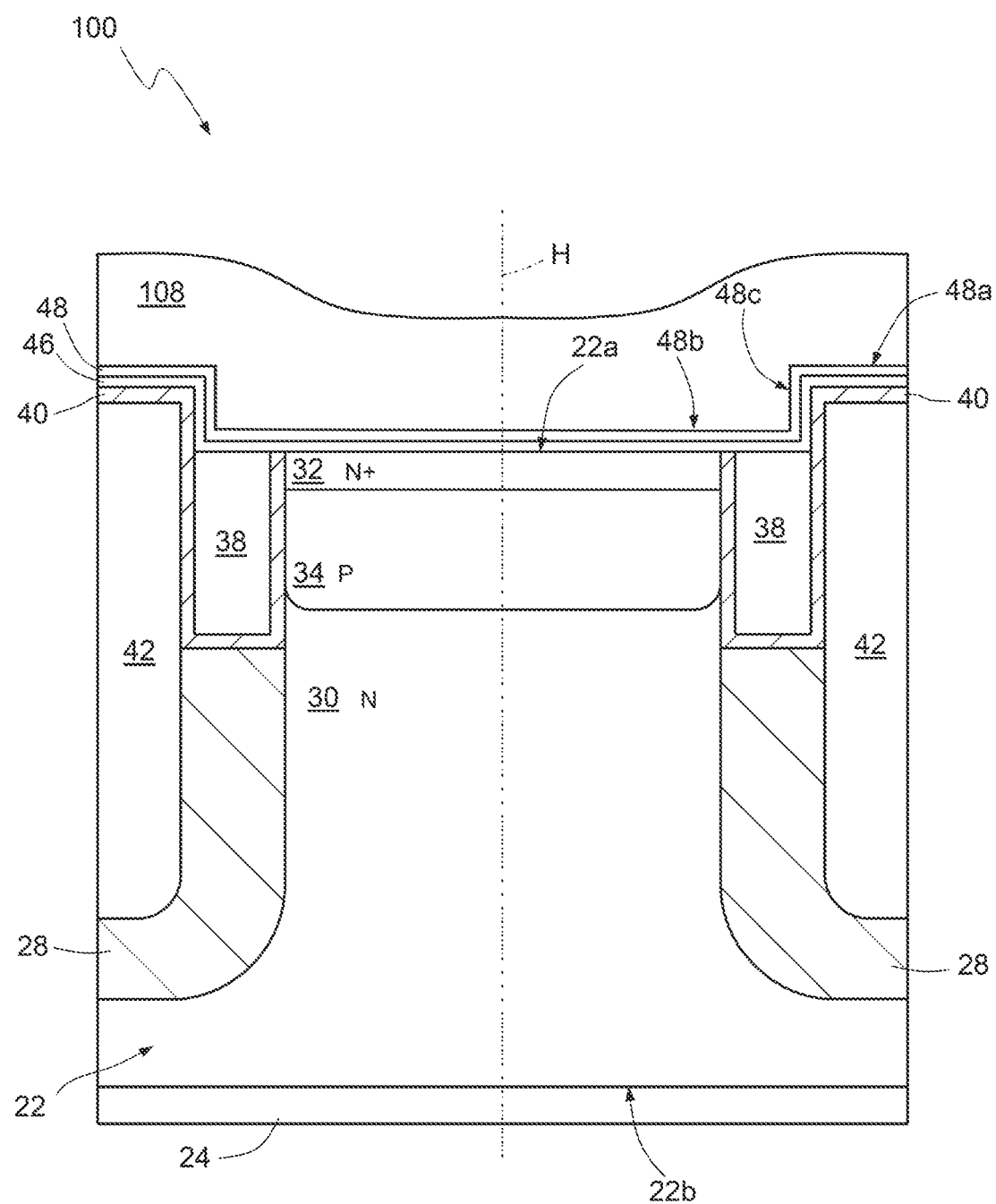

Then, FIG. 16, there follows the stage of forming a dielectric layer 108, for example of silicon dioxide SiO$_2$, of thickness of approximately 1.0 µm above the cell 100, and therefore above the etch-stop layer 48. The dielectric layer 108 is formed for example by deposition, such as for example CVD. The dielectric layer 108 is not planar because of the offset or step S present between the recess electrode 42 and the substrate 22, which as mentioned persists during the stages of forming the multilayer 46, 48, which also has a step between the first surface portion 48a (above the recess electrode 42) and the second surface portion 48b (above the substrate 22). In particular, the dielectric layer 108 has a thickness above the first side 22a of the substrate 22 which reduces with distance (along the X axis in FIG. 16 or generically in the XY plane) from said step to the axis of symmetry H. In other words the dielectric layer 108 extends along the Z axis in such a way that it is a maximum at the vertical walls 48c and reduces gradually by an amount substantially equal to the offset S towards the center (or towards the axis of symmetry H) of the cell 100.

Figure 17:
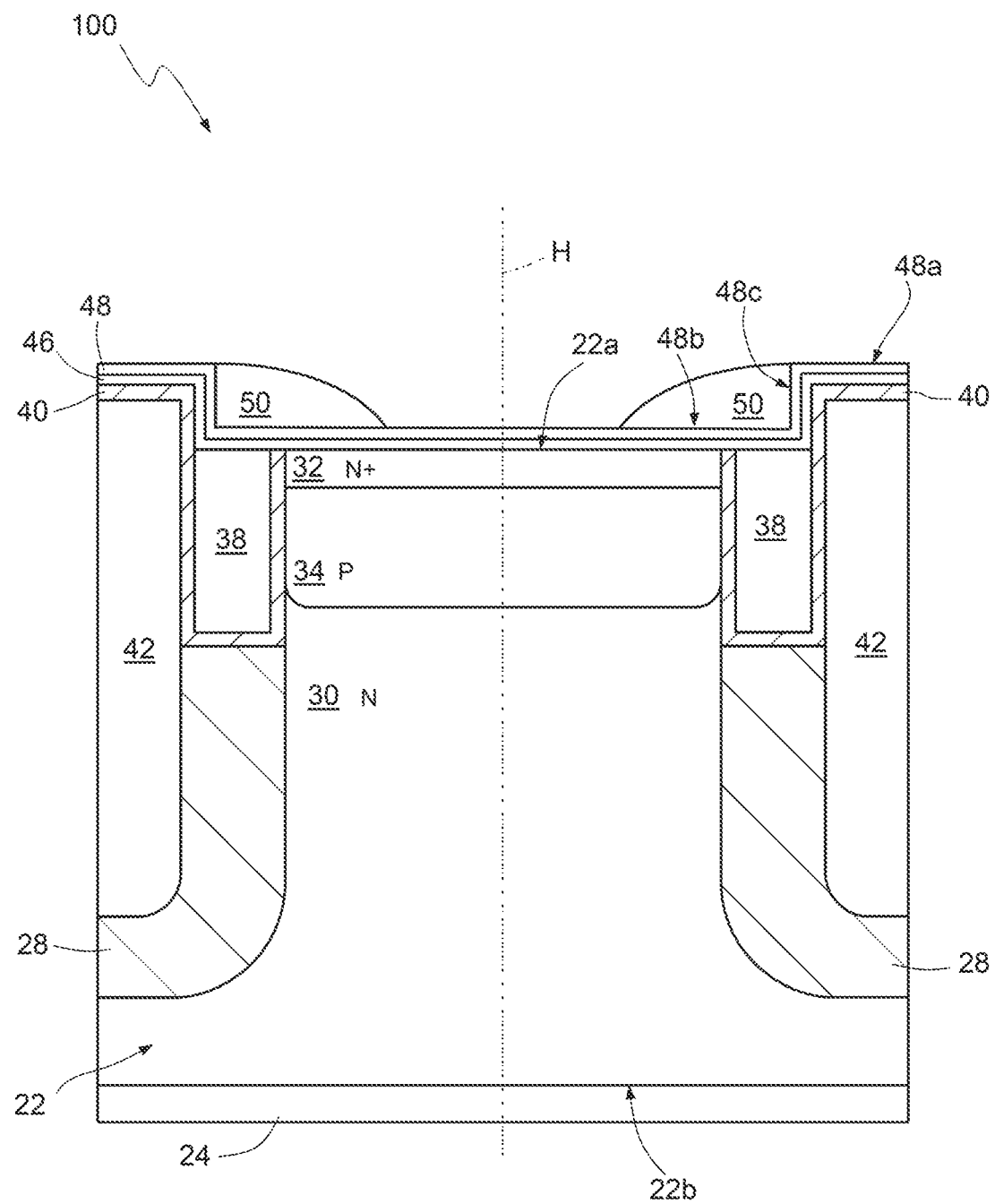
Figure 17:
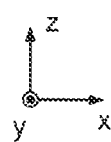

Then, FIG. 17, the dielectric layer 108 is etched in order to form spacers 50. For example, etching of the dielectric layer 108 is carried out by dry etching, and is of the type which is selective with respect to the etch-stop layer 48. Etching continues until it reaches the etch-stop layer 48 and is stopped on reaching the surface portions of the etch-stop layer 48 (in particular on reaching the first surface portion 48a and partly the second surface portion 48b). In other words etching is stopped on complete removal of the portions of the dielectric layer 108 extending above the recess electrode 42 and above a central zone of the substrate 22. However, because the dielectric layer 108 is thicker above the second surface portion 48b close to the vertical walls 48c, after the abovementioned etching stage regions of silicon dioxide remain at the vertical walls 48c above the gate electrode 38 and part of the substrate 22. These regions of silicon dioxide form the spacers 50, which are auto-aligned with respect to the axis of symmetry H.

When viewed in lateral cross section (in the XZ plane) the spacers 50 substantially have the shape of a right-angled triangle in which the short side parallel to the Z axis corresponds to the vertical wall 48c of the etch-stop layer 48 and the short side parallel to the X axis extends towards the axis of symmetry H from the intersection between the vertical wall 48c and the horizontal wall 48b of the etch-stop layer 48.

Figure 18:
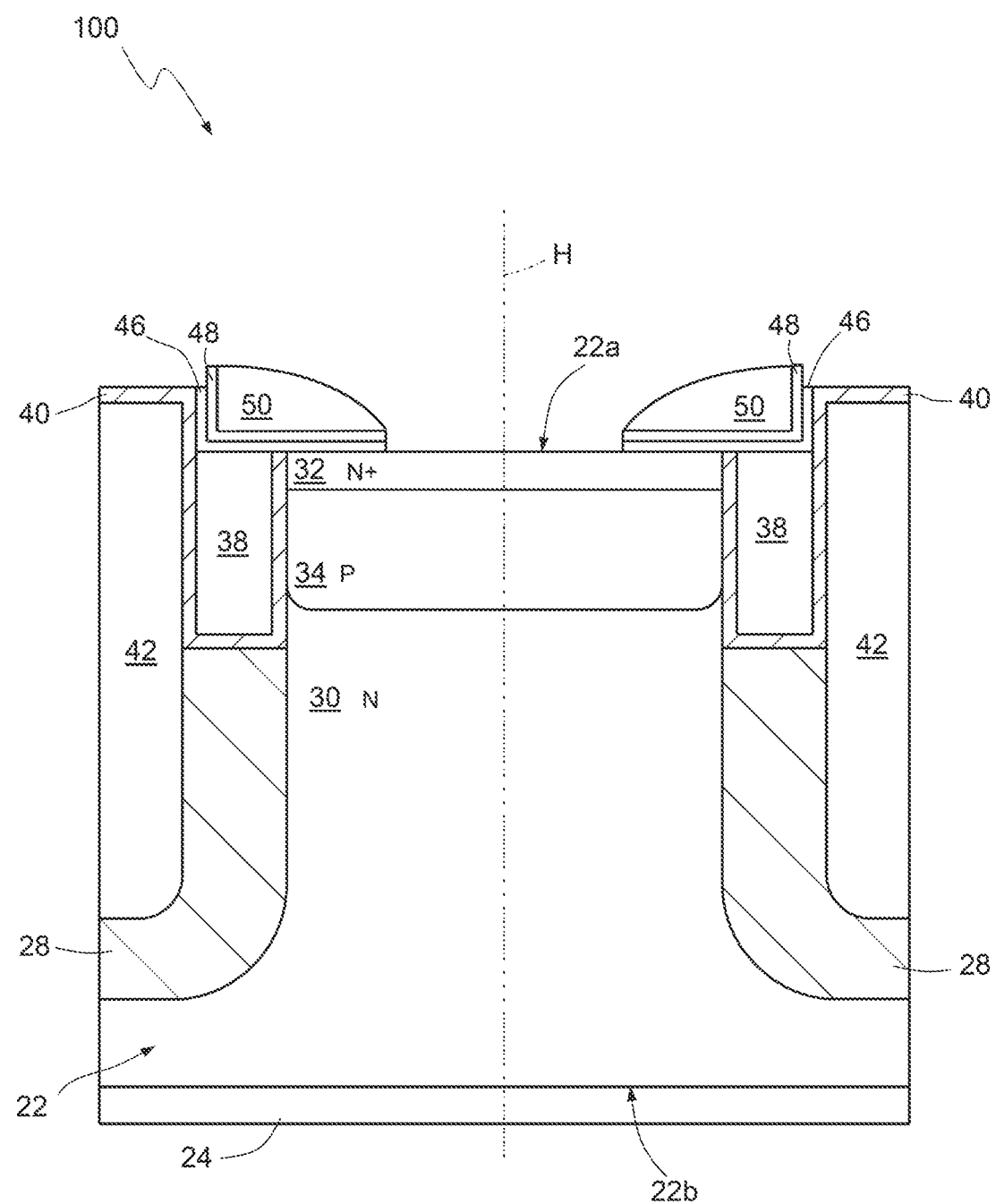

Then, FIG. 18, there follows a stage of etching of the dielectric multilayer formed by the etch-stop layer 48 and the pad oxide layer 46. There then follows etching of the etch-stop layer 48, for example by dry etching, selectively with respect to the pad oxide layer 46 and the spacers 50. When etching is complete portions of the pad oxide layer 46 above the recess electrode 42 and a region of the substrate 22 extending between the spacers 50 are exposed.

Then the pad oxide layer 46 is etched, for example by dry etching, selectively with respect to the substrate 22. As described in this embodiment the spacers 50 may be of the same material (for example silicon dioxide) as the pad oxide 46, and therefore etching of the pad oxide layer 46 may be non-selective with regard to the spacers 50. However, the thickness of the spacers 50 produced by the offset S between the recess electrode 42 and the gate electrode 38 is greater than the thickness of the pad oxide layer 46, so that the spacers 50 are still present when etching of the pad oxide layer 46 is complete. In different embodiments it is however possible to envisage different materials for the pad oxide layer 46 and the spacers 50 so that the stage of etching the pad oxide layer 46 is selective with respect to the spacers 50, which are not even partly removed.

Etching proceeds until the first side 22a of the substrate 22 is reached. When etching is complete the pad oxide layer 46 is completely removed from above the recess electrode 42 and from above the region of the substrate 22 extending between the spacers 50.

Figure 19:
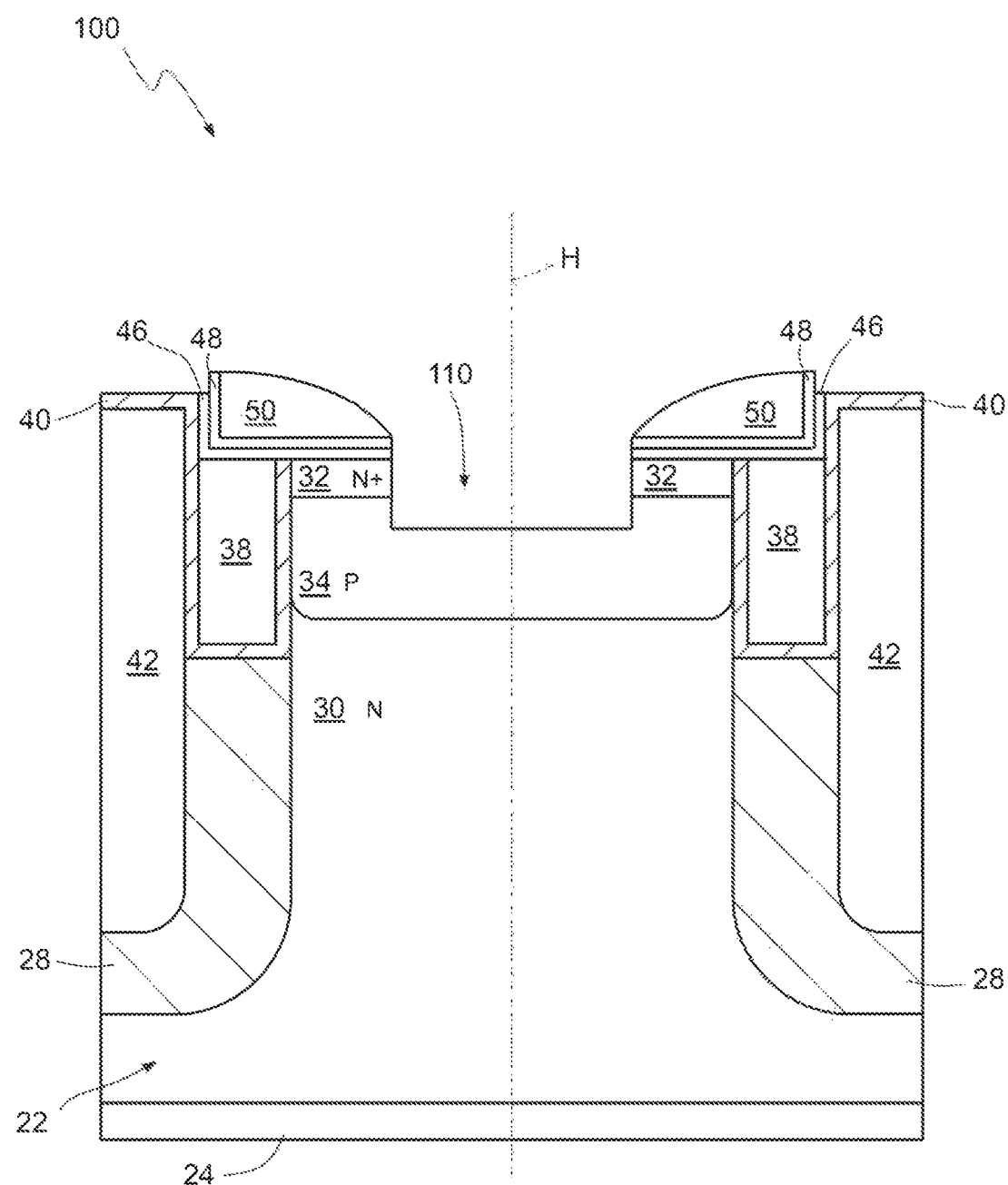

Then, FIG. 19, there follows the stage of forming a recess 110 extending from the first side 22a of the substrate 22 at the region of the substrate 22 between the spacers 50 through part of the substrate 22. The recess 110 extends along the direction of the Z axis for a distance of approximately 0.5 µm. As a consequence the recess 110 extends over the entire thickness of the source region 32 and through part of the body region 34, but does not reach the drain region 30. The recess 110 is formed by anisotropic dry etching, etching the silicon of the substrate 22 selectively with respect to the gate oxide layer 40 and the oxide of the spacers 50. The spacers 50 therefore form a mask for the formation of the recess 110. Because the spacers 50 are symmetrical with respect to the axis of symmetry H, the recess 110 is also symmetrical with respect to the axis of symmetry H.

Figure 20:
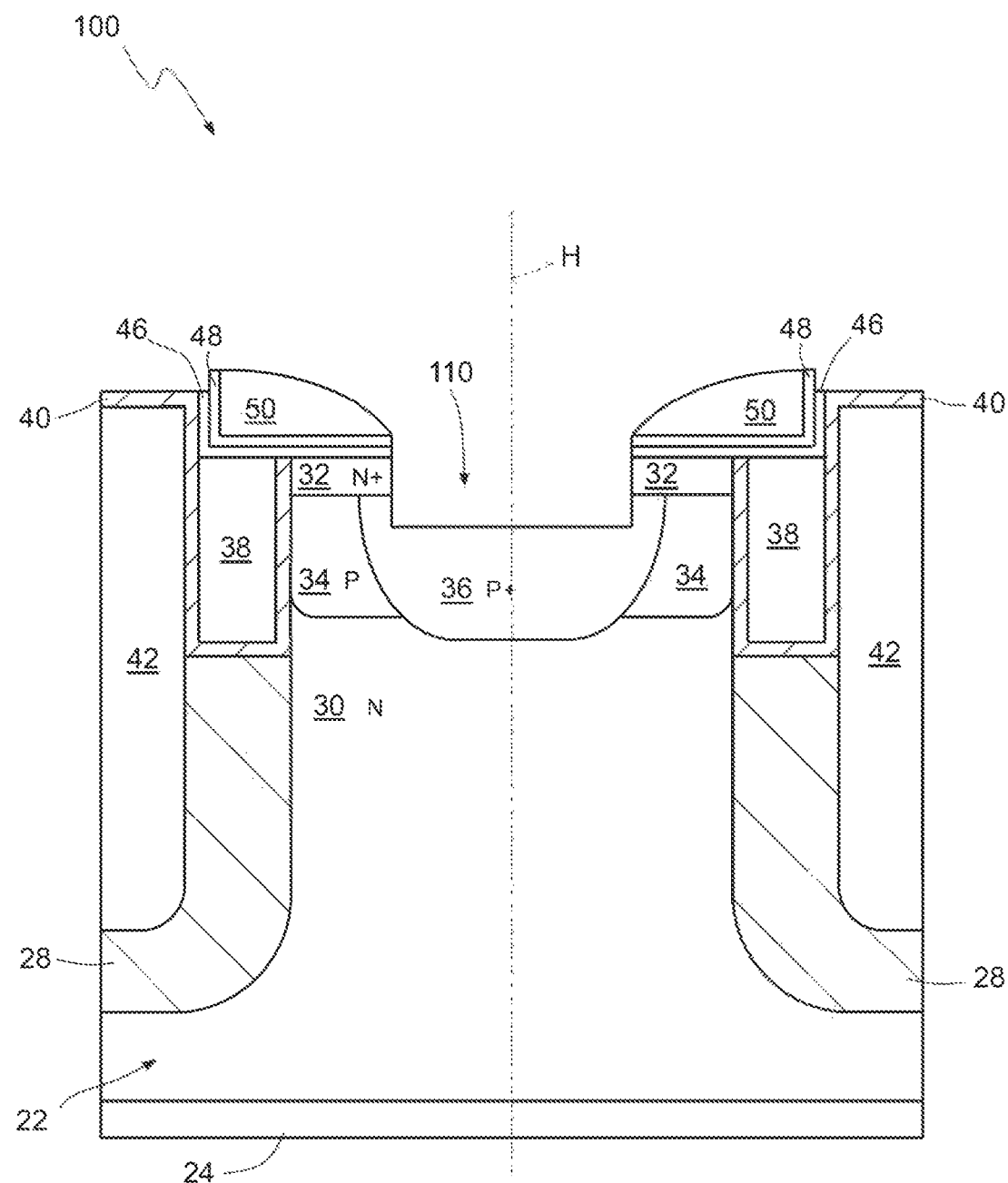

Then, FIG. 20, there follows the stage of forming an enriched body region 36 of the VDMOS transistor 21. For this purpose doping species having the second conductivity (of the P type), for example boron, and greater P+ doping than the doping of the body region 34 are implanted. The gate oxide layer 40 and the spacers 50 form an implanting mask which is auto-aligned with respect to the axis of symmetry H, such that the doping species penetrate the region below the bottom of the recess 110. Implanting is for example carried out with an implanting energy of 40 KeV, achieving a concentration of doping species of approximately $8 \cdot 10^{18}$ atoms/cm$^3$.

Then a stage of heat treatment is performed, for example at a temperature of 1000° C. for a time of 30 minutes, sufficient to cause the implanted region forming the enriched body region 36 to diffuse. Following the thermal diffusion stage the enriched body region 36 also extends laterally to the recess 110.

The enriched body region 36 extends below the recess 110; in one embodiment the enriched body region 36 extends as far as a depth equal to or greater than that of the body region 34 (without however reaching the second side 22b of the substrate 22). In a different embodiment, not illustrated, the enriched body region 36 is completely contained within the body region 34.

Figure 21:
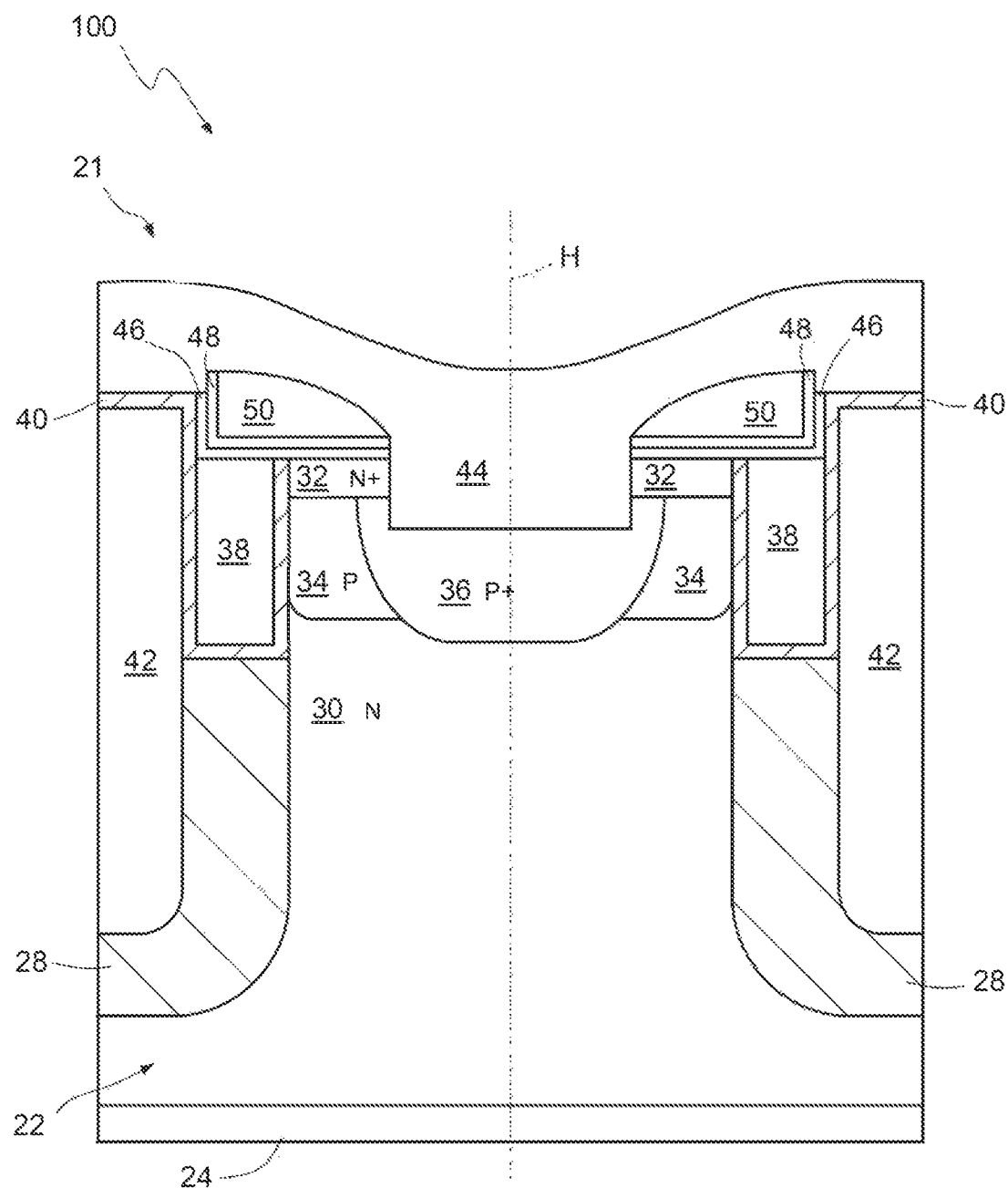

Then, FIG. 21, there is formed a second conducting region 44, for example of a metal material such as aluminum, on the cell 100. The second conducting region 44 completely fills the recess 110 and is therefore in electrical contact with the substrate 22 and in particular with the source region 32 and the enriched body region 36. The second conducting region 44 forms a source electrode of the VDMOS transistor 21.

Through electrical connections which are not shown in FIG. 21 the source electrode 44 can be connected to the recess electrode 42.

Thanks to the symmetry of the recess 110 the source electrode 44 is symmetrical with respect to the axis of symmetry H and auto-aligned with the gate electrode 38.

In particular the distance along the X axis between the gate electrode 38 and the source electrode 44 is the same on both sides of the source electrode 44. In other words the extension of the source region 32 is uniform and symmetrical with respect to the axis of symmetry H of the cell 100.

From the above it follows that the resistance of the conducting path is the same on both sides of the source electrode 44. This symmetry has the result that said resistance is minimized and as a consequence the potential drop between the base and the emitter of the intrinsic parasitic bipolar transistor is minimized when in use. It is therefore possible to increase the current under unclamped inductive switching conditions without causing malfunctions of the VDMOS transistor 21.

Further advantages are discussed below.

In the process of manufacturing the VDMOS transistor 21 the formation of spacers 50 which are symmetrical with respect to the axis of symmetry H makes it possible to form the source electrode 44 so that it is auto-aligned with the gate electrode 38, overcoming the limitations of VDMOS transistors of the known type in which the source electrode is formed by means of photolithographic techniques (with a consequent risk of asymmetry).

Furthermore, the auto-alignment of the source electrode 44 (without using photolithographic masks) makes it possible to increase the area of contact between the source electrode 44 and the substrate 22 and as a consequence to further reduce the electrical resistance of the portion of the body region 34 through which the turn-off current $I_{OFF}$ passes under unclamped inductive switching conditions.

It is thus possible to maximize the capacity of the VDMOS device to control high currents under unclamped inductive switching conditions.

Finally it is clear that modifications and variants may be made to the disclosure described and illustrated here without thereby going beyond the protective scope of the present disclosure as defined in the appended claims. It will be noted that with reference to FIG. 21 the gate electrode 38, the recess electrode 42, the field plate oxide layer 28, the gate oxide layer 40, the source region 32, the body region 34 and the spacers 50 each define two separate regions which are symmetrical with respect to the axis of symmetry H when viewed in lateral cross section (here, in the XZ plane). In a view from above, in the XY plane, the two separate symmetrical regions may have a shape selected according to need and in particular may have a substantially rectangular shape extending along the principal direction parallel to the Y axis.

However, in a different embodiment the gate electrode 38, the recess electrode 42, the field plate oxide layer 28, the gate oxide layer 40, the source region 32, the body region 34 and the spacers 50 have a circular or elliptical shape, or a quadrangular or generically closed polygonal shape when viewed from above in the XY plane, while preserving symmetry with respect to the axis of symmetry H. Thus in this embodiment the regions which are mutually separate and symmetrical in the view in FIG. 21 are sections of a single respective element (that is, the cell 100 of the VDMOS transistor 21 has a single gate electrode 38, a single recess electrode 42, a single field plate oxide layer 28, a single gate oxide layer 40, a single source region 32, a single body region 34 and a single spacer 50, each of which are symmetrical with respect to the axis of symmetry H).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate having a first surface that is opposite to a second surface;
a first doped region in the substrate, the first doped region having a first conductivity type;
a second doped region in the first doped region, the second doped region having a second conductivity type that is different from the first conductivity type;
a third doped region extending through the first doped region, the third doped region having the first conductivity type;
a first opening in the third doped region, the first opening being through the second doped region;
a first electrode in the first opening; and
a second electrode in the substrate, the second doped region being between the first electrode and the second electrode.

2. The device of claim 1 wherein the third doped region is between the second doped region and the second surface of the substrate.

3. The device of claim 2, comprising a spacer structure on the second electrode and the second doped region.

4. The device of claim 3 wherein a first edge of the spacer structure is closer to a sidewall of the first opening than a second edge of the spacer structure.

5. The device of claim 4 wherein the second edge of the spacer structure is closer to an external edge of the second electrode than the first edge of the spacer structure.

6. The device of claim 1 wherein the second doped region extends into the substrate from the first surface a first distance and the third doped region extends into the substrate from the first surface a second distance that is greater than the first distance.

7. The device of claim 6 wherein the first opening extends into the substrate from the first surface a third distance that is less than the first distance.

8. The device of claim 1, comprising a third electrode having a first end opposite a second end, the second end being closer to the second surface of the substrate than the first end.

9. The device of claim 8 wherein the first end of the third electrode extends past the first surface of the substrate.

10. The device of claim 8 wherein second electrode is between the third electrode and the first electrode.

11. A device, comprising:
a substrate having a first surface;
a first doped region in the substrate, the first doped region extending a first distance from the first surface;
a second doped region in the first doped region, the second doped region extending a second distance from the first surface;
a third doped region in the first doped region, the third doped region extending a third distance from the first surface;
an opening through the second doped region, into the first doped region, and into the third doped region, the opening extending a fourth distance from the first surface, the fourth distance being greater than the second distance, the third distance being greater than the first distance;
a first electrode in the opening; and
a second electrode in the substrate.

12. The device of claim 11 comprising a spacer structure on the first surface, the spacer structure being on the second doped region and on the second electrode.

13. The device of claim 12 comprising a third electrode, the second electrode being between the third electrode and the first electrode.

14. The device of claim 13 wherein the spacer structure extends from the third electrode to the opening.

15. The device of claim 14 wherein the spacer structure includes a first insulating layer on the first surface and a second insulating layer on the first insulating layer.

16. The device of claim 15 wherein the spacer structure includes an etch stop layer between the first insulating layer and the second insulating layer.

17. The device of claim 11 wherein the second doped region is between the first electrode and the second electrode.

18. The device of claim 17 wherein the second electrode extends a fifth distance from the first surface, the fifth distance being greater than the third distance.

19. A device, comprising:
a substrate;
a body region in the substrate;
a source region on the body region;
an enriched region through the body region;
an opening completely through the source region, the opening extending in the enriched region;
a source electrode in the opening;
a first electrode in the substrate; and
a second electrode in the substrate, the second electrode being between the first electrode and the source electrode.

20. The device of claim 19 wherein the substrate includes a first surface, the first electrode including a first end that is in the substrate and a second end that extends past the first surface of the substrate.

21. The device of claim 20 wherein the second electrode including a first end that is in the substrate and a second end that is coplanar with the first surface of the substrate.

22. The device of claim 19, comprising a spacer structure on a first surface of the substrate, the spacer structure being on the second electrode and on the source region.

* * * * *